(12) United States Patent
Takemura et al.

(10) Patent No.: US 7,485,923 B2
(45) Date of Patent: Feb. 3, 2009

(54) SOI SEMICONDUCTOR DEVICE WITH IMPROVED HALO REGION AND MANUFACTURING METHOD OF THE SAME

(75) Inventors: Hisashi Takemura, Tokyo (JP); Risho Koh, Tokyo (JP); Yukishige Saito, Tokyo (JP); Jyonu Ri, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/490,599

(22) PCT Filed: Oct. 2, 2002

(86) PCT No.: PCT/JP02/10289

§ 371 (c)(1),
(2), (4) Date: Mar. 25, 2004

(87) PCT Pub. No.: WO03/032401

PCT Pub. Date: Apr. 17, 2003

(65) Prior Publication Data

US 2005/0151172 A1    Jul. 14, 2005

(30) Foreign Application Priority Data

Oct. 2, 2001 (JP) ............................ 2001-306543

(51) Int. Cl.
*H01L 29/772* (2006.01)
(52) U.S. Cl. ............... 257/336; 257/327; 257/335; 257/347; 257/E21.618; 257/E21.633
(58) Field of Classification Search ............... 257/336, 257/344, 408, E29.278, E29.435, 335, 347, 257/E21.618, E21.633
See application file for complete search history.

(56) References Cited

U.S. PATENT DOCUMENTS

| 5,936,278 | A | 8/1999 | Hu et al. | |
| 6,426,278 | B1 * | 7/2002 | Nowak et al. | 438/528 |
| 6,541,821 | B1 * | 4/2003 | Krishnan et al. | 257/347 |
| 6,953,979 | B1 * | 10/2005 | Yamaguchi et al. | 257/446 |
| 2002/0033511 | A1 * | 3/2002 | Babcock et al. | 257/408 |

FOREIGN PATENT DOCUMENTS

EP    0 803 911 A2    10/1997

(Continued)

*Primary Examiner*—Phat X. Cao
*Assistant Examiner*—Abul Kalam
(74) *Attorney, Agent, or Firm*—Young & Thompson

(57) ABSTRACT

A semiconductor device includes a first insulating layer, a semiconductor layer formed on the first insulating layer, a second insulating layer on a part of the semiconductor layer, and a gate electrode formed on the semiconductor layer through the second insulating layer. The semiconductor layer includes a low concentration region formed under the gate electrode through the second insulating layer, two high concentration regions which are formed in at least upper regions on outer sides of the low concentration region under the gate electrode through the second insulating layer, and have an impurity concentration higher than an impurity concentration of the low concentration region, respectively, and two source/drain regions which are formed in side portions of the high concentration regions to have low concentration region side end portions, respectively. A width of the high concentration region is equal to or less than 30 nm.

13 Claims, 22 Drawing Sheets

FOREIGN PATENT DOCUMENTS

| | | |
|---|---|---|
| EP | 0 902 482 A1 | 3/1999 |
| JP | 60-126867 | 7/1985 |
| JP | 4-367278 | 12/1992 |
| JP | 5-21800 | 1/1993 |
| JP | 6-268215 | 9/1994 |
| JP | 9-45919 | 2/1997 |
| JP | 9-293871 | 11/1997 |
| JP | 10-4198 | 1/1998 |
| JP | 11-87719 | 3/1999 |
| JP | 11-204783 | 7/1999 |
| JP | 2000-349295 | 12/2000 |

* cited by examiner

SURFACE    END OF BURIED
           INSULATING FILM

PN JUNCTION INTERFACE

PN JUNCTION INTERFACE

SOI SEMICONDUCTOR DEVICE WITH IMPROVED HALO REGION AND MANUFACTURING METHOD OF THE SAME

TECHNICAL FIELD

The present invention relates to a semiconductor device and a manufacturing method of the same, and more particularly to a semiconductor device such as a MOSFET formed on an SOI (silicon-on-insulator) substrate which has an SOI layer and a manufacturing method for the same.

BACKGROUND ART

An SOI substrate is known as a semiconductor substrate in which an insulating film (an oxide film in many cases) is formed on a substrate and a semiconductor layer (a silicon layer) is formed on it. In a MOSFET to which such an SOI substrate is applied, because the insulating film is formed under a source region and a drain region, a parasitic capacitance can be made smaller compared with a case of a usual bulk substrate in which the SOI layer is not used. As a result, the SOI substrate is superior in high speed operation of the device and it has been widely used.

Generally, the MOSFETs using the SOI substrate is grouped into a fully depleted SOI-MOSFET in which the SOI layer below the gate is depleted and a partially depleted SOI-MOSFET in which the SOI layer is not fully depleted so that a neutral region is left. The partially depleted SOI-MOSFET has an advantage that it can be manufactured by a manufacturing method in which a process for a bulk substrate is used. However, because the neutral region which is electrically separated from the substrate is left, the potential of the neutral region changes depending on an operation condition and operation current changes, namely, so-called floating body effect is caused. For this reason, circuit design becomes difficult.

On the other hand, because there is not an neutral region in the fully depleted SOI-MOSFET, the potential under the channel does not change and there is an advantage that the circuit operation is stable.. However, in the full depleted transistor, unless the SOI layer is made extremely thin, the characteristic degradation of the device is easy to be caused due to punch-through and short channel effects, compared with the partially depleted SOI transistor.

A measure to the characteristic degradation is proposed in which Halo regions where a channel impurity concentration is high are formed on both sides of the channel region. Such a conventional technique is known in Japanese Laid Open Patent Application (JP-A-Heisei 9-293871). FIGS. 1 and 2 show such a semiconductor device.

Referring to FIG. 1, SD (source and drain) regions 103 are formed in the SOI substrate in which a buried insulating film 102 of an oxide film is formed on a base substrate 101 of silicon and a semiconductor layer is formed on the buried insulating film 102. A low concentration region 104 for a channel region and the Halo implantation regions 105 are formed in the region, and a gate insulating film 106, a gate electrode 107, side wall insulating films 108 are formed. Especially, the Halo implantation region 105 has an impurity density profile of the shape shown in FIG. 2 in a lateral direction. The setting of the Halo region with such a high impurity density profile is excellent to restrain the floating body effect.

The profile N(x) of the Halo region 105 of such a conventional semiconductor device in the lateral direction is expressed by the following equation.

$$N(x) = N_0 + N_{B0} \cdot |\exp(-[\eta \cdot (x - L/2]g) + \exp(-[\eta \cdot (x + L/2]g)|$$

When $\eta$ is in a range from 8 to 20 or the concentration inclination in the lateral direction is in $3-8 \times 10^{22}$ cm$^{-4}$, the current gain $h_{fe}$ of a parasitic bipolar transistor formed by the SD regions 103 and the low concentration region 104 can be reduced. In addition to the restraint of the short channel effect, the fine and stable operation becomes possible.

However, in the above-mentioned conventional example, the spreading of the impurity distribution from the peak into the lateral direction is about 0.1 μm. When a device is formed to have a gate length of a sub half micron range, the tails of the impurity profiles from both sides overlap and the Halo structure cannot be formed to have high concentration regions on both sides.

If the tails of the impurity profiles from both sides overlap, the impurity concentration in the center portion of the channel region rises, so that the partially depleted SOI-MOSFET operation is easy to be carried out. That is, the fully depleted MOSFET operation becomes difficult. It is demanded that the technique which restrains the floating body effect is established and the technique is different from the conventional method of setting a concentration inclination (a range of $\eta$ from 8 to 20 or the concentration inclination in the lateral direction is $3-8 \times 10^{22}$ cm$^{-4}$) in accordance with the principle of the conventional example.

Conventionally, the SOI-MOSFETs having various Halo regions are proposed. However, they does not described the effective knowledge to form ideal impurity distribution nor suggests what impurity distribution is proper. Because the gate oxide film becomes thin if the miniaturization of the transistor proceeds, the channel impurity concentration increases to get a necessary threshold voltage. With the increase, the minimum potential decreases so that it is easy to carry out the partially depleted SOI-MOSFET operation. In case of the N-channel transistor, the minimum potential decreases, in case of the P-channel transistor, the maximum potential increases. Thus, the same problem is caused in the N-channel transistor and the P-channel transistor. Hereinafter, the N-channel transistor will be described in this description as long as special notation is necessary. However, it could be understood to the person in the art that the same thing can be applied to the P-channel transistor. In the channel concentration in which the fully depleted MOSFET operation is carried out, it is known that the threshold voltage decreases, and a measure to it is needed.

In conjunction with the above description, an SOI transistor is disclosed in Japanese Laid Open Patent Application (JP-A-Heisei 9-45919). In this conventional example, the transistor is composed of a semiconductor substrate, a buried insulating layer formed on the semiconductor substrate, a semiconductor layer section, a gate insulating film, a gate electrode layer, and a channel region. The semiconductor layer section is arranged on the buried insulating layer and is composed of a top surface, a bottom surface contacting the buried insulating layer, a source region and a drain region. The gate insulating layer is arranged on the top surface of the semiconductor layer section between the source region and the drain region. The gate electrode layer is arranged on the gate insulating layer. The channel region is arranged on the buried insulating layer under the gate insulating layer and is arranged at the semiconductor layer section between the source region and the drain region. The channel region has a top dopant concentration in correspondence to the top surface of the semiconductor layer section, and a bottom dopant concentration in correspondence to the bottom surface of the semiconductor layer section. Here, the top dopant concentration is higher than the bottom dopant concentration.

Also, a silicon semiconductor transistor having a Halo implantation region is disclosed in Japanese Laid Open Patent Application (JP-A-Heisei 10-4198). In this conventional example, the transistor is composed of an insulating layer, and a semiconductor mesa which includes a first surface in contact with the insulating layer and a second surface opposite to the first surface. The semiconductor mesa is composed of a first source/drain region of a first conductive type, a second source/drain region of the first conductive type, a body region, and an implantation region. The body region has a first dopant level of a second conductive type, contacts the insulating layer, extends to the second surface of the mesa and is arranged between the first source/drain region and the second source/drain region. The implantation region is arranged between the first source/drain region and the body region to separate the first source/drain region from the body region. Also, the implantation region is of a second conductive type and has a dopant level which is substantively equal to or higher than the first dopant level.

Also, a semiconductor device is disclosed in Japanese Laid Open Patent Application (JP-A-Heisei 11-204783. In this conventional example, in the semiconductor device includes a MIS-type electric field effect-type transistor. A region where halogen elements or halogen ions such as fluorine and chlorine exist is provided in at least one of a surface region and an inside region of the active region of the MIS-type electric field effect-type transistor of the semiconductor substrate.

Also, a field effect transistor is disclosed in Japanese Laid Open Patent Application (JP-P 2000-349295). In this conventional example, the field effect transistor is composed of a semiconductor layer, a gate electrode, a source region and a drain region of a first conductive type. An element formation semiconductor layer is covered with an insulator at the bottom at least. A gate electrode is provided on the gate insulating film which is formed on the semiconductor layer. The source region and the drain region of the first conductive type are formed in the semiconductor layer on both sides of the gate electrode. A position where the second conductive type impurity concentration is maximum in the semiconductor layer under the gate electrode is nearer to the semiconductor layer surface than a maximum depth of an inverted layer in the neighborhood of the semiconductor layer surface when the gate electrode is supplied with a voltage larger than a threshold voltage. Also, the second conductive type impurity concentration is monotonously decreased from the maximum depth of the inverted layer toward a boundary between the semiconductor layer and the insulator.

DISCLOSURE OF INVENTION

An object of the present invention is to provide a semiconductor device and a manufacturing method of the same, in which a fully depleted MOSFET operation can be achieved and decrease of a threshold voltage can be restrained.

Another object of the present invention is to provide a semiconductor device and a manufacturing method of the same, in which a fully depleted MOSFET operation can be achieved and decrease of a threshold voltage can be restrained, by optimizing an impurity distribution of a Halo region.

In an aspect of the present invention, a semiconductor device includes a first insulating layer; a semiconductor layer formed on the first insulating layer; a second insulating layer on a part of the semiconductor layer; and a gate electrode formed on the semiconductor layer through the second insulating layer. The semiconductor layer includes a low concentration region formed under the gate electrode through the second insulating layer; two high concentration regions and two source/drain regions. The high concentration regions are formed in at least two upper regions on outer sides of the low concentration region under the gate electrode through the second insulating layer, and have an impurity concentration higher than that of the low concentration region, respectively. The source/drain regions are formed in side portions outside the high concentration regions to have low concentration region side end portions, respectively. The width of the high concentration region is equal to or less than 30 nm.

Here, the semiconductor layer may further include two diffusion barrier regions formed between the high concentration regions and the low concentration region, respectively, to prevent diffusion of impurity in the high concentration regions into the low concentration region.

Also, it is desirable that the impurity concentration gradually decreases in a direction from the low concentration region side end portions of the source/drain regions to a center portion of the low concentration region.

Also, the impurity concentration of the high concentration region is desirably lower than $1/10$ of the impurity concentration at the low concentration region side end portion of each of the source/drain regions at a position apart from the low concentration region side end portions of the source/drain regions by 30 nm.

Also, a horizontal gradient of the impurity concentration of the high concentration region is desirably higher than $1 \times 10^{24}$ cm$^{-4}$ at a position apart from the low concentration region side end portions of the source/drain regions into a direction of the low concentration region by 20 nm.

Also, the low concentration region may be an intrinsic region, the high concentration regions may be of a first conductive type, and the source/drain regions may be of a second conductive type which is different from the first conductive type.

Otherwise, the low concentration region and the high concentration regions may be of a first conductive type, and the source/drain regions may be of a second conductive type which is different from the first conductive type.

In this case, the low concentration region may include a first conductive type upper region; and a low concentration region diffusion barrier region formed under the first conductive type upper region to prevent downward diffusion of an impurity of the first conductive type upper region.

Also, the semiconductor device may further include a second conductive type region which is formed under the low concentration region and the high concentration region not to contact the source/drain regions.

Also, it is desirable that the impurity concentration of the low concentration region is high in an upper region on a side of the second insulating layer and is low in a lower region on a side of the first insulating layer.

Also, the impurity concentration of the low concentration region may be high in an upper region on a side of the second insulating layer, may become low once in a lower region on a side of the first insulating layer, and may increase with approaching a boundary with the first insulating layer.

Also, it is desirable that a peak value of the impurity concentration of the upper region is larger three times than a peak value of the impurity concentration of the lower region.

In another aspect of the present invention, a manufacturing method of a semiconductor device is achieved by (a) forming a semiconductor layer on a first insulating layer; by (b) forming a low concentration region; by (c) forming a second insulating layer on the semiconductor layer; by (d) forming a gate electrode on the low concentration region through the second insulating film; by (e) forming high concentration regions on outer sides of the low concentration region in the semiconductor layer under the gate electrode to have a width equal to or less than 30 nm in a surface direction; and by (f) forming source/drain electrodes in the semiconductor layer outside the high concentration regions.

Here, the manufacturing method may further include (g) forming diffusion prevention regions between the high concentration region and the low concentration region to prevent diffusion of impurity from the high concentration region into the low concentration region.

Also, the (e) forming is desirably achieved by forming the high concentration region such that the impurity concentration of each of the high concentration regions decreases gradually in a direction from a low concentration region side end portions of the source/drain region to a center portion of the low concentration region.

Also, it is desirable that the impurity concentration of the high concentration region is lower than $1/10$ of an impurity concentration at end portions of the source/drain regions at a position apart from the low concentration region side end portions of the source/drain regions by 30 nm.

Also, it is desirable that a horizontal gradient of the impurity concentration of the high concentration region is higher than $1 \times 10^{24}$ cm$^{-4}$ at a position apart from the low concentration region side end portions of the source/drain regions by 20 nm.

Also, the low concentration region and the high concentration region may be of a first conductive type, and the source/drain regions may be of a second conductive type which is different from the first conductive type.

In this case, when the low concentration region has an upper region and a lower region, the (b) forming may be achieved by forming a diffusion barrier region to prevent downward diffusion of a first conductive type impurity implanted into the upper region in the lower region of the low concentration region; and by implanting the first conductive type impurity in the upper region of the low concentration region.

Also, the manufacturing method may further include forming a second conductive type region under the low concentration region and the high concentration region not to contact the source/drain regions.

Also, it is desirable that in the (b) forming, the low concentration region is formed such that the impurity concentration of the low concentration region is high in an upper region on a side of the second insulating layer, and becomes low in a lower region on a side of the first insulating layer.

Also, the (b) forming may be achieved by forming the low concentration region such that the impurity concentration of the low concentration region is high in an upper region on a side of the second insulating layer, becomes low once in a lower region on a side of the first insulating layer, and increases with approaching a boundary with the first insulating film.

Also, it is desirable that a peak value of the impurity concentration of the upper region is higher three times than a peak value of the impurity concentration of the lower region.

In another aspect of the present invention, a semiconductor device includes a first insulating layer; a semiconductor layer formed on the first insulating layer; a second insulating layer formed on the semiconductor layer; and a gate electrode formed on the semiconductor layer through the second insulating film. The semiconductor layer includes a channel region formed under the gate electrode through the second insulating film; two source/drain regions formed outside the channel region in the semiconductor layer. The impurity concentration of the channel region is lower than $1/4$ of an impurity concentration of the channel region at end portions of the source/drain regions at a position apart from the end portions of the source/drain regions by 20 nm.

BEST MODE FOR CARRYING OUT THE INVENTION

Hereinafter, a semiconductor device and a manufacturing method of the same of the present invention will be described in detail with reference to the attached drawings.

Figure 1:
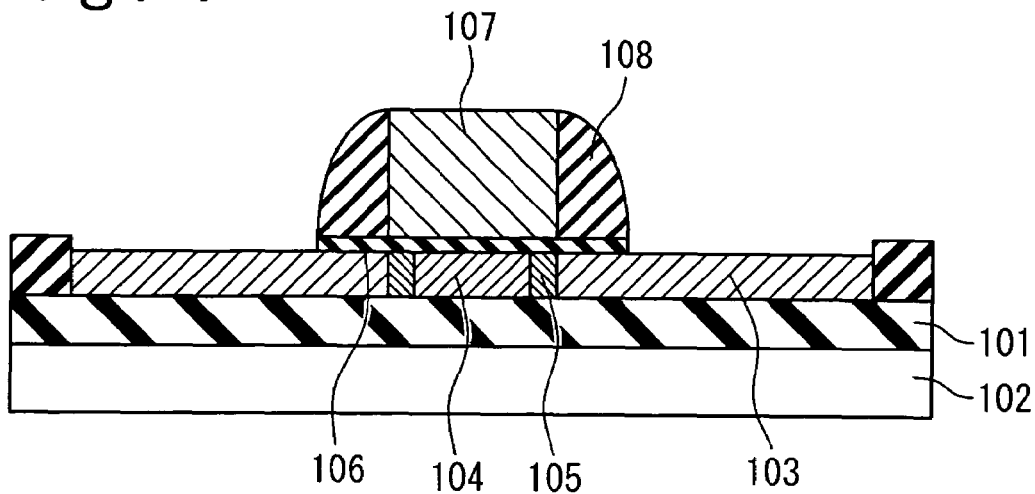
FIG. 1 is a cross section view showing the structure of a conventional semiconductor device.
Figure 2:
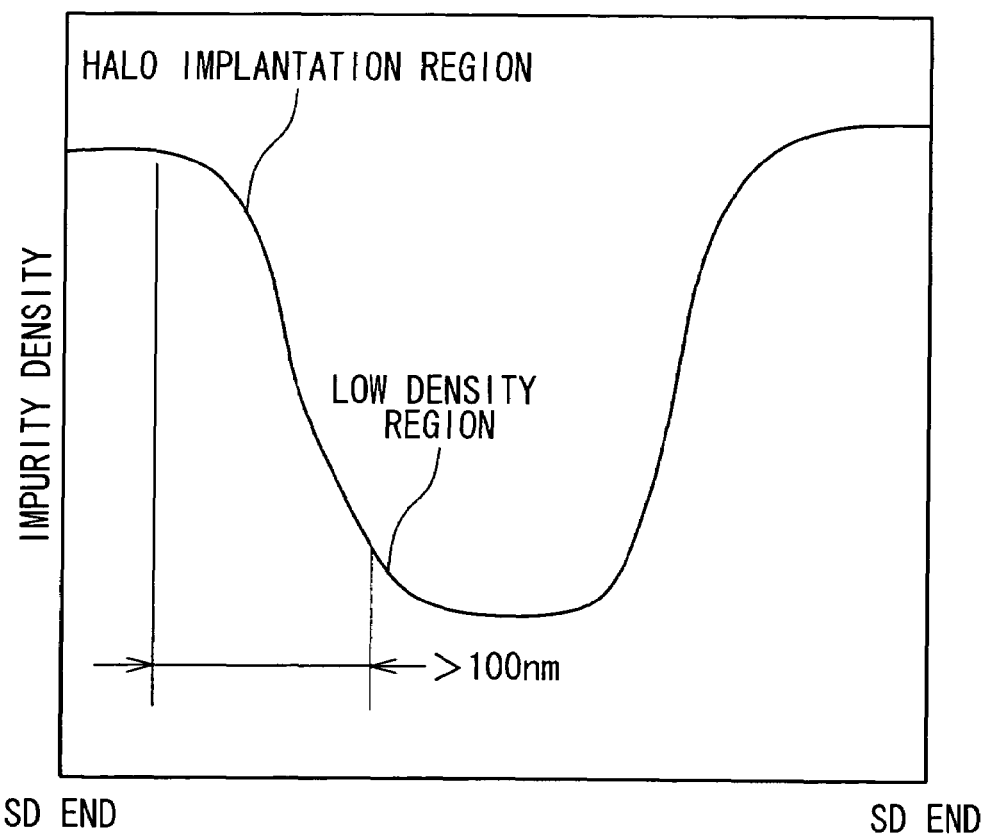
FIG. 2 is a graph showing an impurity density profile in the semiconductor device shown in FIG. 1.
Figure 3:
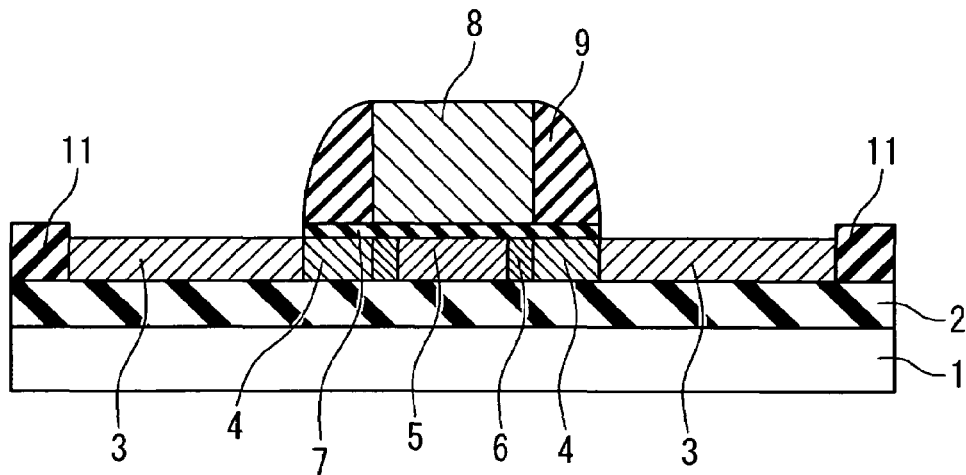
FIG. 3 is a cross section view showing the structure of a semiconductor device according to a first embodiment of the present invention.

FIG. 3 is a cross sectional view showing the structure of the semiconductor device according to the first embodiment of the present invention. Referring to FIG. 3, in the semiconductor device according to the first embodiment of the present invention, a buried insulating film 2 is formed on a semiconductor substrate 1. A silicon substrate exemplifies the substrate, and an oxide film exemplifies the buried insulating film 2. The semiconductor layer of silicon is laminated on the buried insulating film 2. N-type SD regions 3 are formed in the semiconductor layer on an SOI substrate having such a laminated structure. N-type SD extension regions 4 are formed to be connected to the respective SD regions. A P-type low concentration region 5 is formed as a channel region on the central region between the SD extension regions 4. A P-type Halo implantation region 6 is formed between each of the SD extension regions 4 and the low concentration region 5.

A gate insulating film 7 is formed on the SD extension regions 4, the low concentration region 5 and the Halo implantation regions 6. A gate electrode 8 is formed on the gate insulating film 7. A side wall insulating film 9 is formed on either side of the gate electrode 8. A field insulator 11 is formed at an outer end of the SD region 3 for device isolation.

Figure 4:
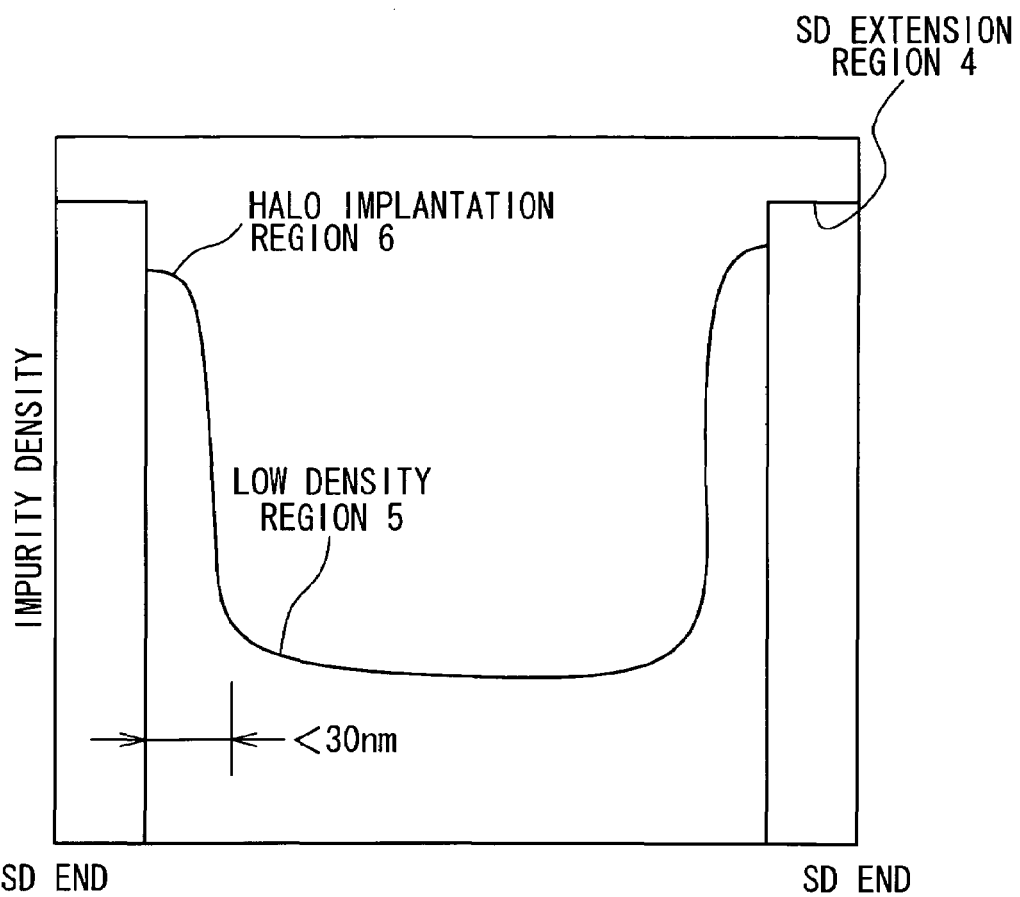
FIG. 4 is a graph showing an impurity density profile in a lateral direction in the semiconductor device according to the first embodiment of the present invention.

As shown in FIG. 4, it is essentially important that the width of the Halo implantation region 6 in a lateral direction is equal to or less than 30 nm. When the Halo implantation region width is equal to or less than 30 nm, the short channel effect can be restrained without changing the threshold voltage in an FET which has a small gate length of equal to or less than 0.1 µm.

Figure 5A:
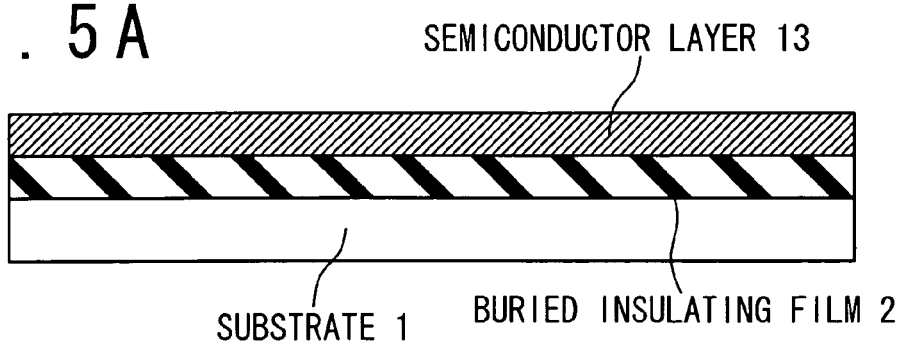
FIGS. 5A to 5H are cross sectional views showing a manufacturing method of the semiconductor device according to the first embodiment of the present invention.

FIGS. 5A to 5H show a manufacturing method of the semiconductor device according to the first embodiment of the present invention. As shown in FIG. 5A, the buried insulating film 2 as the oxide film is formed on the substrate 1 formed of silicon or semiconductor insulation material such as sapphire to have a proper thickness, e.g. 100 nm. Next, the semiconductor layer 3' of silicon is deposited on the buried insulating film 2 to have a proper thickness in a range of 5 nm to 2 µm. The SOI substrate having such a laminate structure can be formed by the SIMOX method through an ion implantation of oxygen in the silicon substrate or be formed as the laminate structure.

Figure 5B:
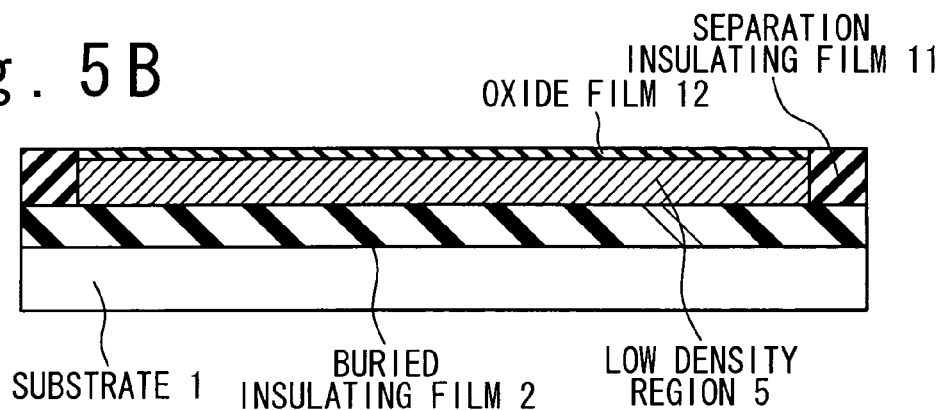

Next, as shown in FIG. 5B, the field insulator 11 as a device isolation region is formed on the either outer end of the semiconductor layer 3 by a LOCOS method or a trench separation method. Subsequently, an oxide film 12 with the thickness of 10 nm is formed on the semiconductor layer 3 by a thermal oxidation. Subsequently, impurities are added into the semiconductor layer 3 by the ion implantation method to form the low concentration region 5.

Figure 5C:
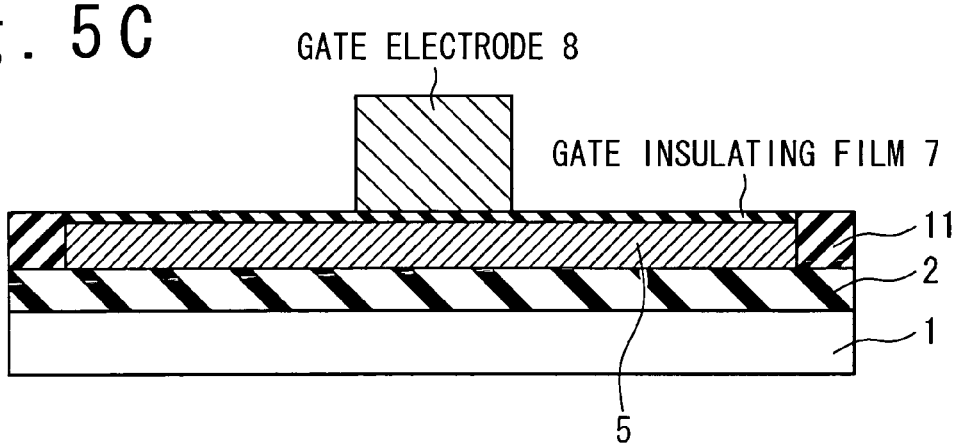

Next, as shown in FIG. 5C, the oxide film 12 is removed and the gate insulating film 7 is formed as the oxide film with the thickness of about 2 nm by the thermal oxidation technique. Subsequently, a polysilicon film is deposited on the gate insulating film 7 to have the thickness of 200 nm. The polysilicon film is selectively etched to form the gate electrode 8. The gate insulating film 7 is limited to the oxide film and may be formed of a nitride film and a film of other insulation material.

Figure 5D:
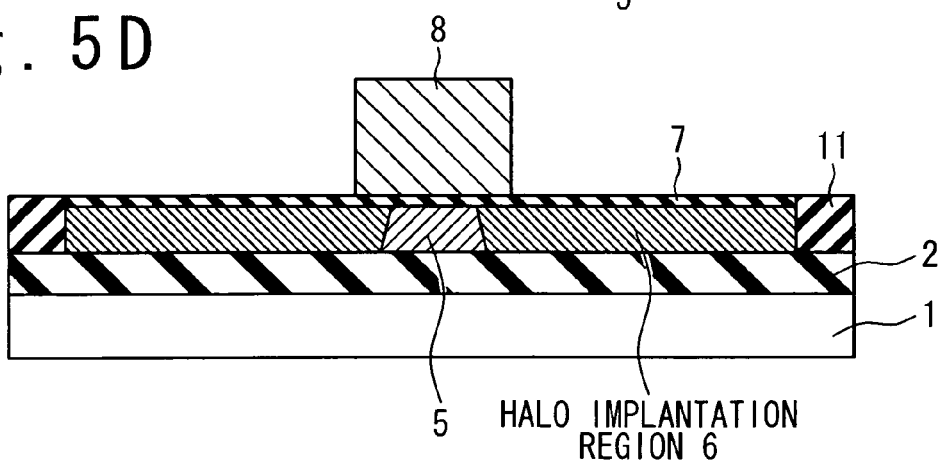

Next, as shown in the FIG. 5D, the gate electrode 8 is used as a mask to form the Halo implantation region 6 having the impurity density higher than the impurity density of the low concentration region 5. In this implantation process, ions are implanted from a diagonal or oblique direction into a region below the gate electrode 8 via the gate insulating film so that the low concentration region 5 can be defined. In this way, by changing the implantation angle in the diagonal implantation, the width of the Halo implantation region 6 in the lateral direction can be adjusted.

Figure 5E:
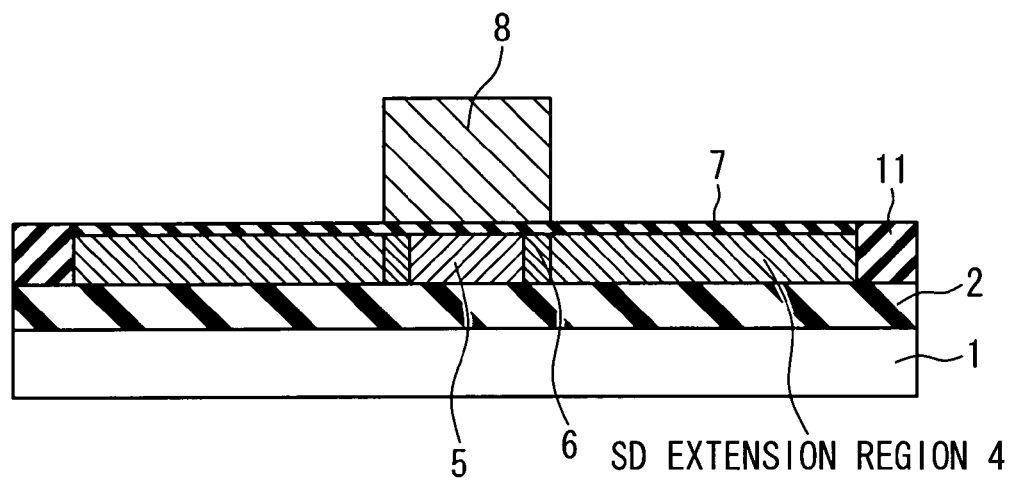

Next, as shown in FIG. 5E, the SD extension regions 4 having a conductive type opposite to the conductive type of the low concentration region 5 and the Halo implantation region 6 are formed by the implantation method. The SD extension regions 4 are formed on the outside of the Halo implantation regions 6 and the ion implantation direction is perpendicular direction to the surface of the SOI substrate.

Through such an ion implantation method, the Halo implantation region 6 is formed on the inside of the SD extension region 4. The width of the Halo implantation region 6 can be changed by adjusting a geometrical condition such as the implantation angle and a thermal diffusion process condition. In the present invention, the width of the Halo implantation region 6 is set to be an equal to or less than 30 nm.

Figure 5F:
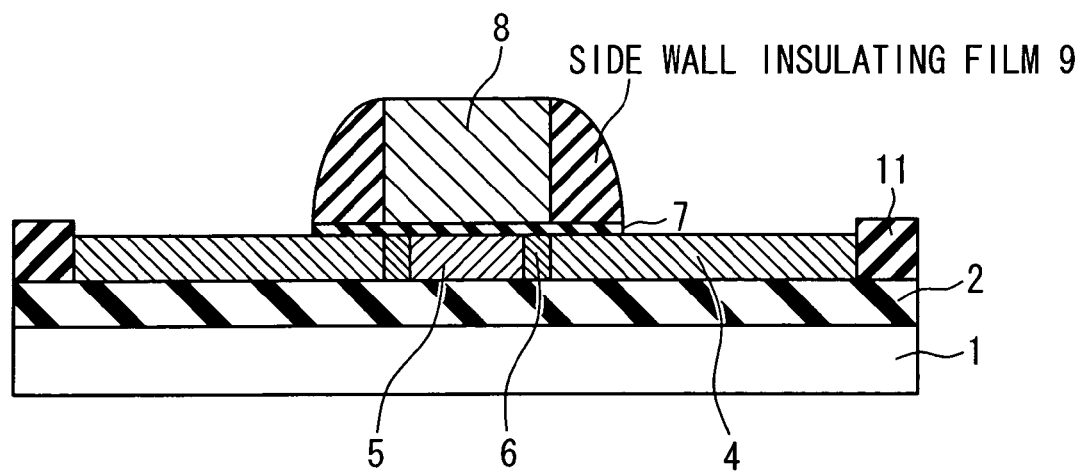

Next, as shown in FIG. 5F, an insulating film, e.g. an oxide film is deposited by the CVD method to have the thickness of about 150 nm. Anisotropic etching is carried out such that the insulating film is left on the side walls of the gate electrode 8. Thus, side wall insulating films 9 are formed through the etching. At the same time, the gate insulating film 7 is etched.

Figure 5G:
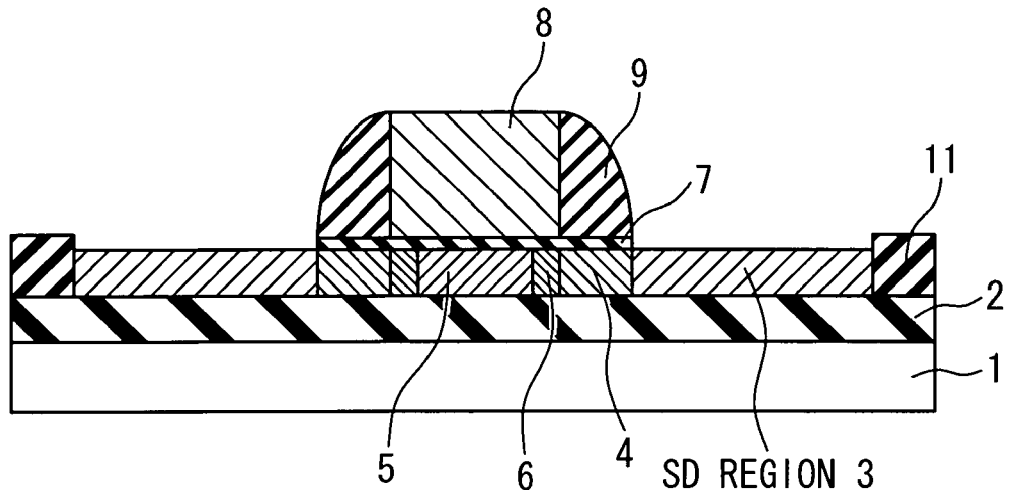

Next, as shown in FIG. 5G, impurity atoms are added into the SD extension regions 4 to form the SD regions 3 by the ion implantation method using the gate electrode 8 and the side wall insulating films 9 as a mask.

Figure 5H:
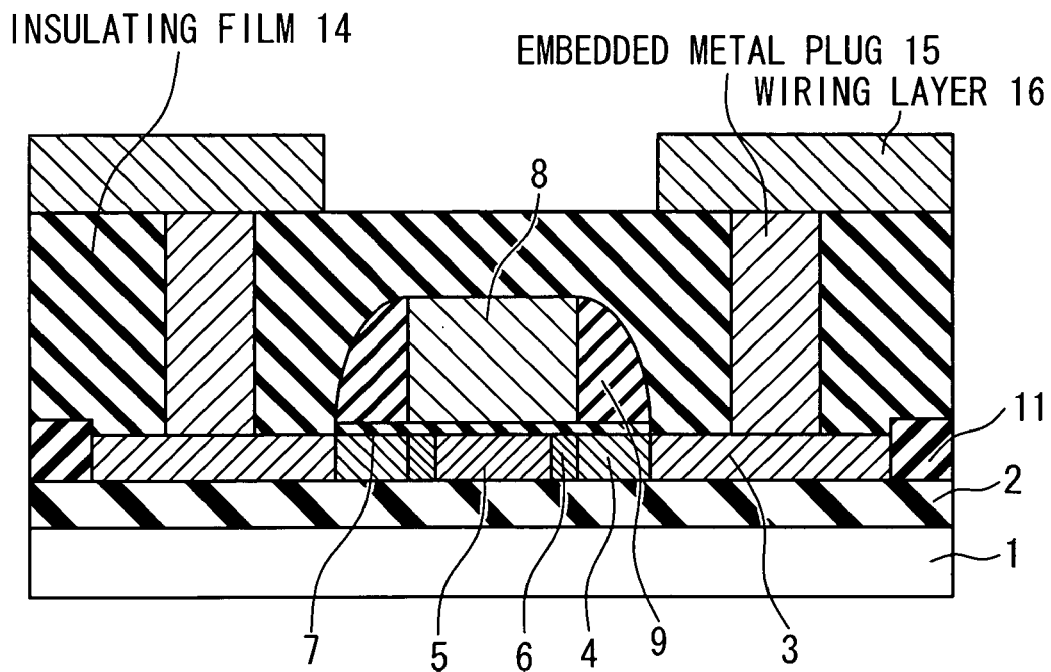

Next, as shown in FIG. 5H, an insulating film 14 is formed over the whole surface, and contact regions are opened in the insulating film 14. A metal film is deposited by the CVD method to form an embedded metal plug in the opening for the contact region and then the metal film is removed by the CMP method. As a result a FET is produced.

In order to reduce a resistance of the SD region, it is desirable that a cobalt silicide film is formed on the SD regions 3 and the gate electrode 8 by sputtering atoms such as Co and carrying out a thermal treatment, after the process of FIG. 5G.

Also, in the above, the threshold voltage is controlled by adding the impurity in the low concentration region 5 by the technique such as the ion implantation. However, the low concentration region 5 may be substituted to a so-called intrinsic semiconductor region in which no impurity atom is added. In this case, the gate electrode is formed as a metal gate having a different work function from polysilicon. Thus, it is possible to achieve control of the threshold voltage by the metal gate and high mobility in the channel of the intrinsic semiconductor. In case of the intrinsic semiconductor, it is possible to prevent degradation of the semiconductor device characteristics due to punch-through and formation of a channel on the side of the buried insulating film, by forming the Halo implantation regions. Moreover, it is possible to form a device with a small gate length equal to or less than 0.1 µm by controlling the width of the Halo implantation region 6.

The width of the Halo implantation region 6 is finally determined based on the implantation angle of the ion implantation in the formation of the Halo implantation region, an implantation energy, diffusion of implanted ions in the lateral direction, an ion implantation condition for formation of the SD extension regions in the later process, and diffusion of implanted ions into the lateral direction. The technique for the formation of the Halo implantation region is not limited to the ion implantation method, and another technique such as solid diffusion to add impurity may be applied. In the above, though the low concentration region is formed by the technique to add impurity through the ion implantation, it is not limited to this. An intrinsic semiconductor may be used. In this case, the mobility of carriers is higher than in case that the impurity is added. Thus, a merit of improvement of device character in operation speed is achieved. A fully depleted MOSFET operation can be carried out by setting the width of the Halo implantation region equal to or less than 30 nm, more desirably 20 nm. In case that the width of the Halo implantation region is larger than 40 nm, it becomes easy for a partially depleted SOI-MOSFET operation to be caused, as the gate length is made finer.

Figure 6:
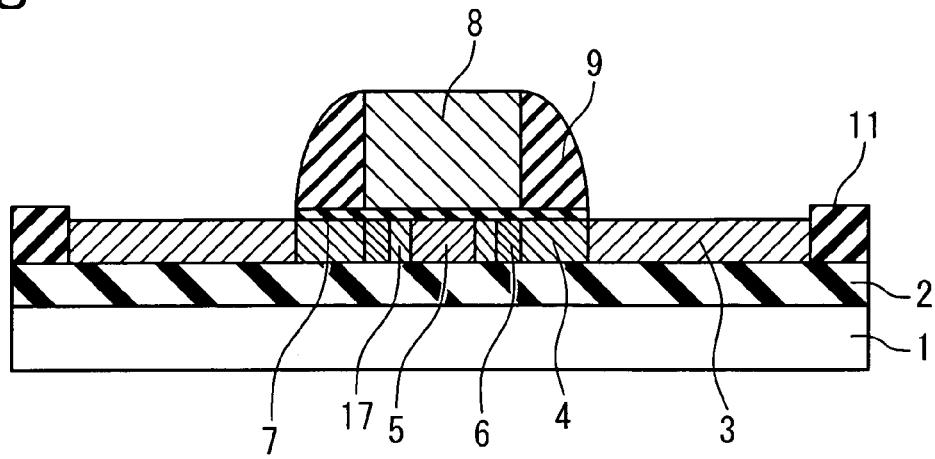
FIG. 6 is a cross section view showing the structure of the semiconductor device according to a second embodiment of the present invention.

FIG. 6 shows a semiconductor device according to the second embodiment of the present invention. Referring to FIG. 6, a buried insulating film 2 as an oxide film is formed on a substrate 1 to have the thickness from 10 nm to 500 nm. A semiconductor layer of silicon is laminated on the buried insulating film 2 to have the thickness from 10 nm to 500 nm. In this way, a SOI substrate of the laminated structure is formed.

SD regions 3, SD extension regions 4, Halo implantation regions 6 and a low concentration region 5 are formed on the SOI substrate in the same way as the first embodiment of the present invention. Moreover in the same way of the first embodiment, a gate insulating film 7, a gate electrode 8 and side wall insulating films 9 are formed. Especially in the second embodiment of the present invention, a diffusion barrier region 17 is formed on each side end of the low concentration region 5 in the directions of the Halo implantation regions 6, that is, the diffusion barrier regions 17 are formed between the low concentration region 5 and each of the Halo implantation regions 6. The diffusion barrier region 17 can be formed by an adding technique such as an ion implantation method to add atoms such as fluorine or carbon.

Figure 7:
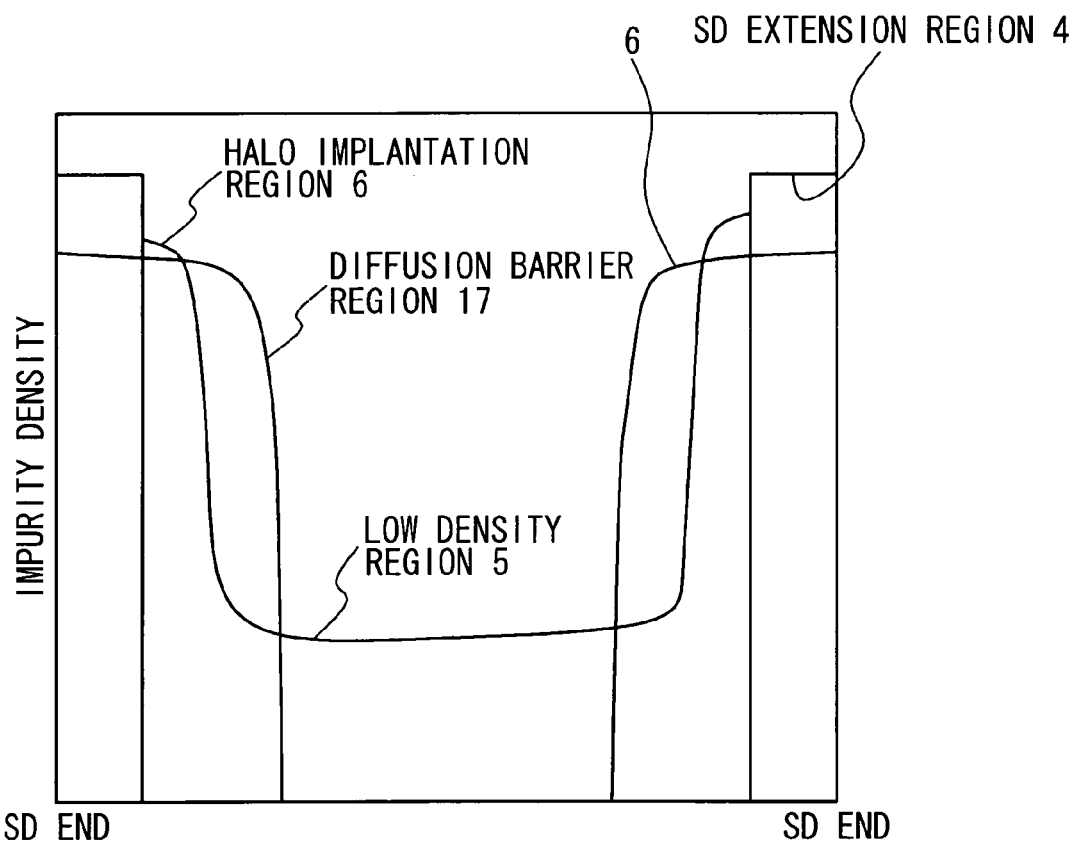
FIG. 7 is a diagram showing an impurity density profile in the semiconductor device according to the second embodiment of the present invention.

FIG. 7 shows an impurity concentration profile in the lateral direction between the SD regions 4 in a semiconductor device according to the second embodiment of the present invention. As shown in FIG. 7, the Halo implantation regions 6 are formed on the both sides of the low concentration region 5 put between the SD extension regions 4. The diffusion barrier regions 17 are respectively formed between the low concentration region 5 and the Halo implantation regions 6. Especially, the diffusion barrier region 17 in which fluorine or the like is added in this way has an effect to reduce a boron diffusion rate and can restrain the spread of the width of the Halo implantation region 6. Through such a restraint effect, an element with a finer gate length is provided.

Figure 8A:
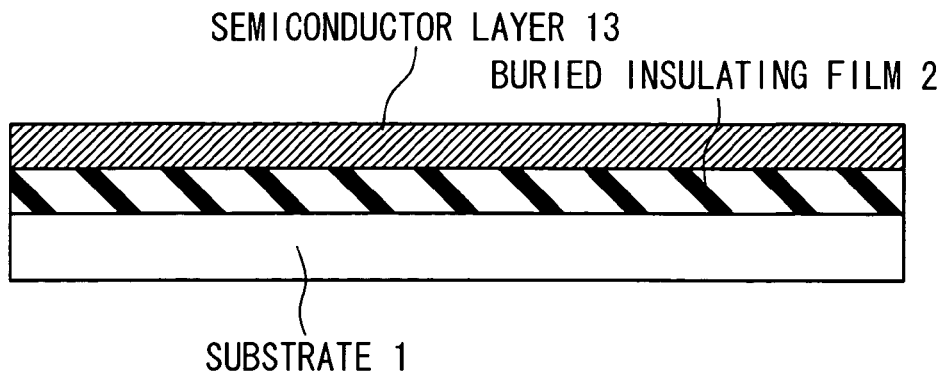
FIGS. 8A to 8I are cross sectional views showing a manufacturing method of the semiconductor device according to the second embodiment of the present invention.

FIGS. 8A to 8I show a manufacturing method of the semiconductor device according to the second embodiment of the present invention. As shown in FIG. 8A, a buried insulating film 2 with the thickness of 100 nm is formed as the oxide film on the substrate 1 formed of silicon or an insulation material such as sapphire. Moreover, a semiconductor layer 13 of silicon is laminated on the buried insulating film 2 to have the thickness from 5 nm to 2 μm. Thus, a SOI substrate is formed.

Figure 8B:
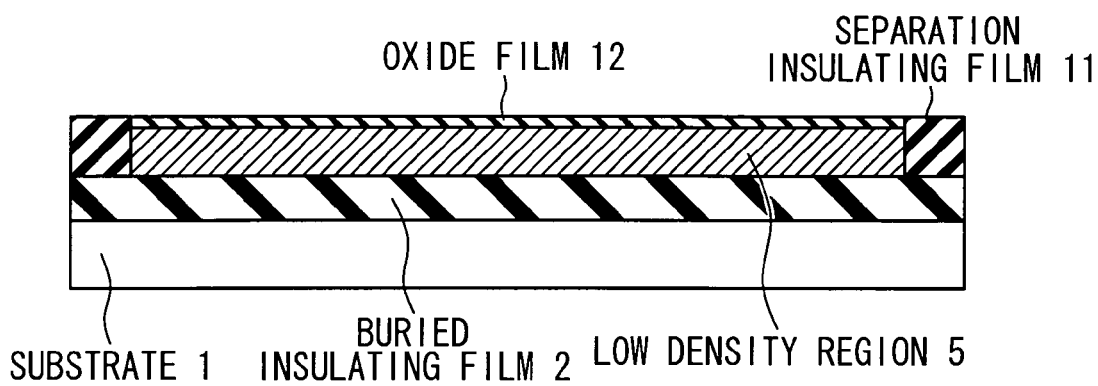

Next, as shown in FIG. 8B, field insulator 11 are formed as device isolation regions by a LOCOS method or a trench separation method. An oxide film 12 of 10 nm in thick is formed on the semiconductor layer 13 by a thermal oxidation. Subsequently, impurity is added to the semiconductor layer 13 so that the low concentration region 5 is formed.

Figure 8C:
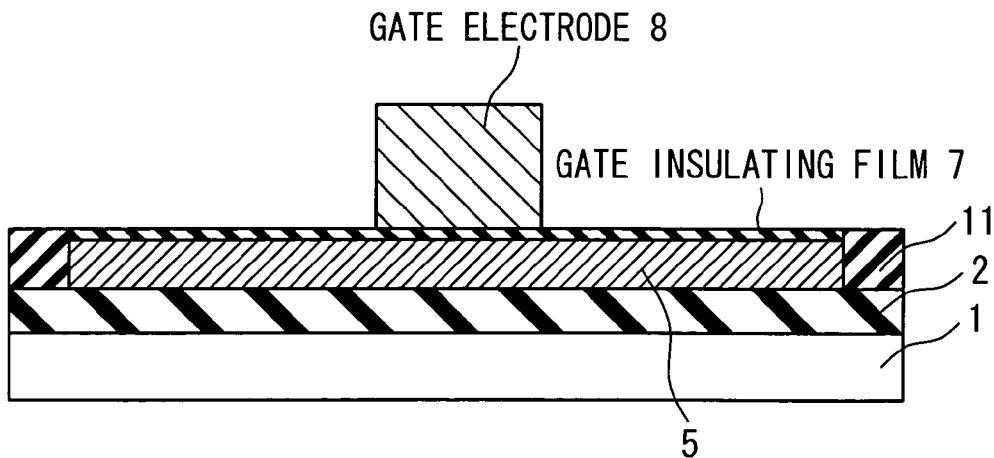

Next, as shown in FIG. 8C, the oxide film 5 is removed and the gate insulating film 7 is formed by the thermal oxidation as the oxide film with the thickness of about 2 nm. Subsequently, a polysilicon film is deposited in the thickness of 200 nm, and is selectively etched to form the gate electrode 8.

Figure 8D:
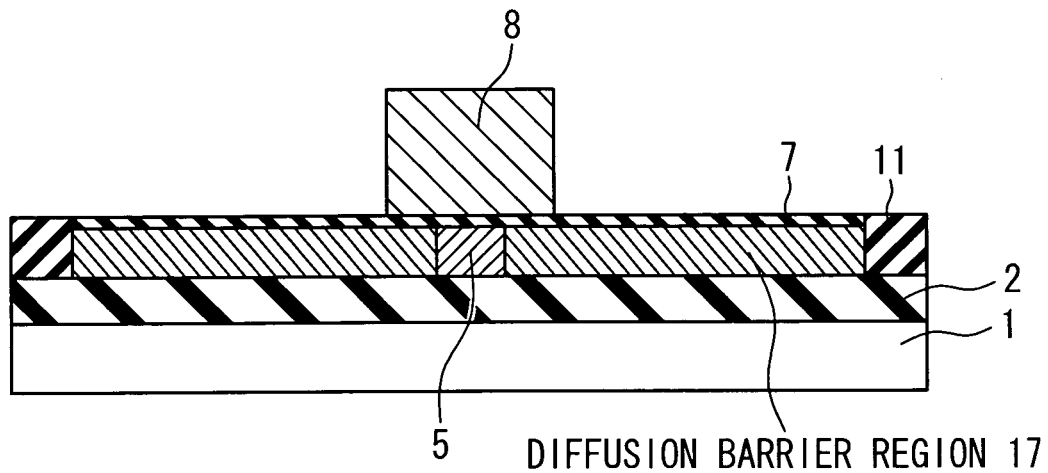

Next, as shown in FIG. 8D, the gate electrode 8 is used as a mask to add fluorine or carbon in a dose quantity from $10^{12}$ $cm^{-2}$ to $10^{16}$ $cm^{-2}$ from a diagonal or oblique direction by the ion implantation method.

Figure 8E:
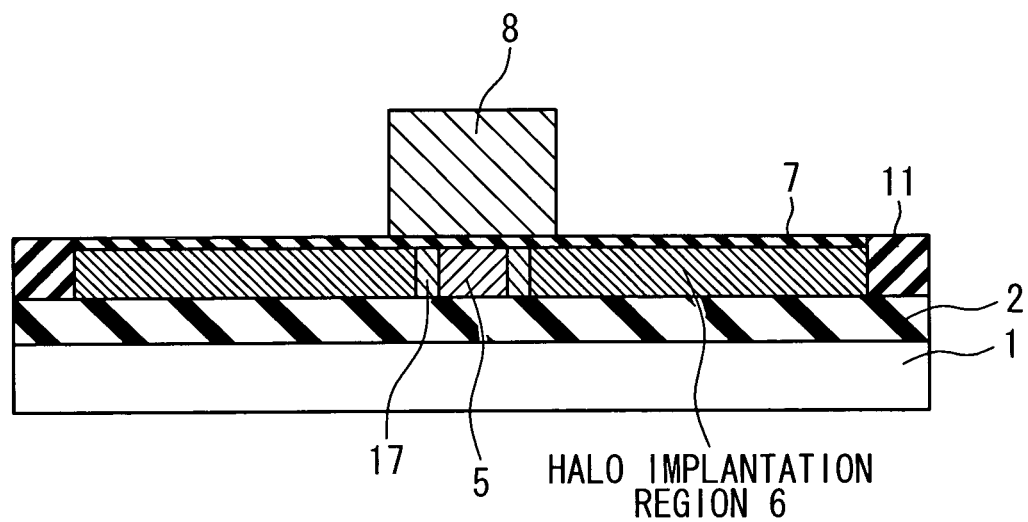

Next, as shown in FIG. 8E, ions are implanted from the diagonal or oblique direction. That is, boron is implanted in NMOS, arsenic is implanted in PMOS, from the diagonal direction as the impurities. Here, the Halo implantation regions 6 can be formed on the outer side of each of the diffusion barrier regions 17 by the ion implantation in which the implantation angle is smaller than that in the formation of the diffusion barrier regions 17 in the previous process, or by implantation energy which leads the shallow implantation.

Figure 8F:
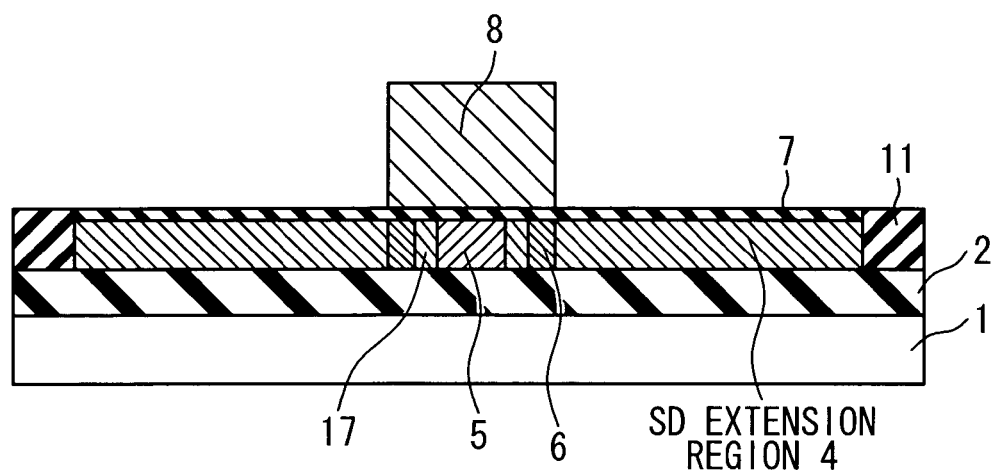

Next, as shown in FIG. 8F, the impurities of a conductive type opposite to that of the low concentration region 5 and the Halo implantation region 6, for example, boron in the NMOS and arsenic in PMOS, are added by the ion implantation method to form the SD extension regions 4. In this case, the impurity is implanted from the perpendicular direction. Thus, the Halo implantation regions 6 are formed on the inside of the SD extension regions 4.

In this way, the Halo implantation region 6 is formed between the SD extension region 4 and the diffusion barrier region 17. By controlling a thermal treatment condition after this process, the width of the Halo implantation region 6 can be varied and especially, can be controlled to be equal to or less than 30 nm. Because the diffusion rate of the impurity implanted into the Halo implantation region 6 in the diffusion barrier region 17 is slow, it is hard for the impurity of the Halo implantation region 6 to diffuse toward the low concentration region 5 at the thermal treatment process. As a result, the characteristics of the transistor never degrade even if the gate length is made finer and the low concentration region 5 is made narrower.

Figure 8G:
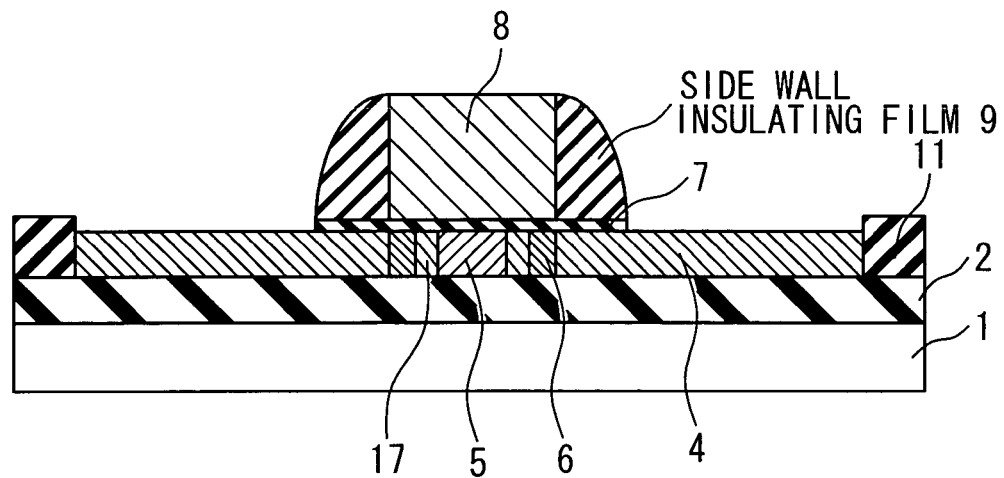

Next, as shown in FIG. 8G, an insulating film as the oxide film is deposited by the CVD method to have the thickness of about 150 nm, and the insulating film is etched by anisotropic etching. In this way, the side wall insulating films 9 remain on the sides of the gate electrode 8 and the gate insulating film 7 is etched at the same time.

Figure 8H:
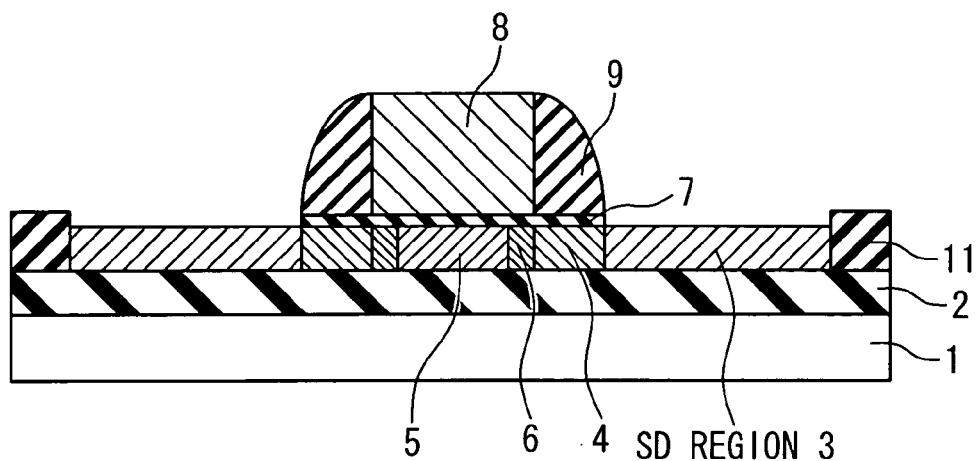

Next, as shown in FIG. 8H, the gate electrode 8 and the side wall insulating films 9 are used as a mask, and the impurity is added by the ion implantation method. Thus, the SD regions 3 are formed.

Figure 8I:
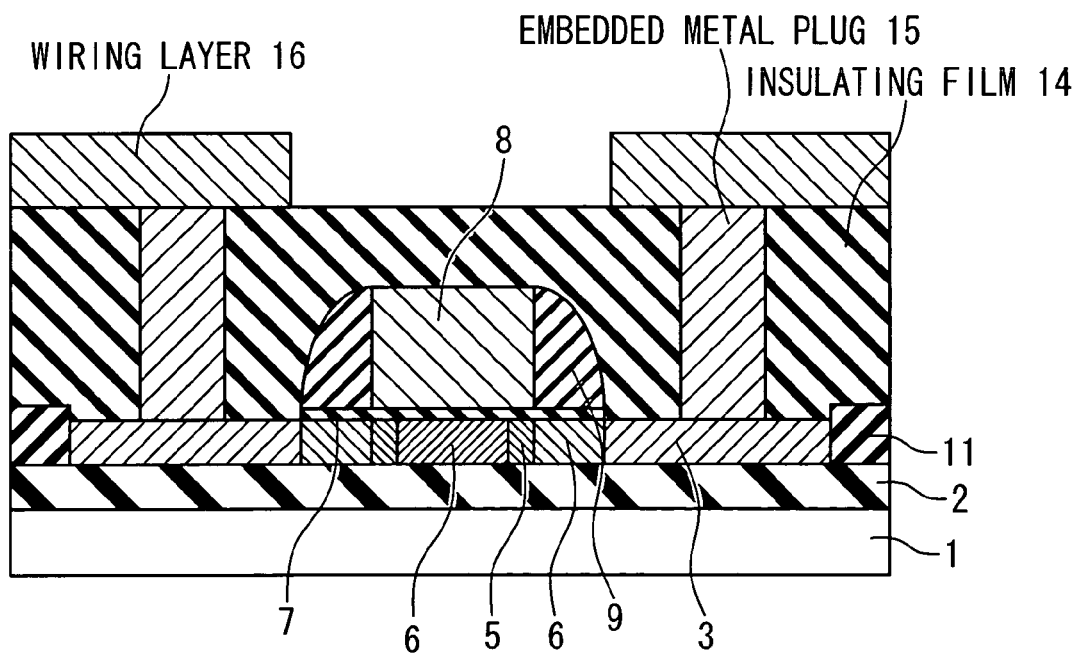

Next, as shown in FIG. 8I, an insulating film 14 is formed over the whole surface and openings for contact regions are produced in the insulating film 14. A metal film is deposited and embedded metal plugs 15 are formed in the contact regions. Then, wiring line layers 16 are selectively formed on the contact region, and an FET is produced.

As mentioned above, according to the second embodiment, it is possible to restrain that the impurity in the Halo implantation region 6 diffuses toward the low concentration region, even if the thermal treatment is carried out after the formation of the Halo implantation region. Also, the Halo implantation region can be formed even in a finer gate length with a good controllability. The technique for forming the diffusion barrier region 17 is not limited to the technique for forming it through the implantation from the diagonal or oblique direction using the gate electrode as a mask. A technique may be also adopted in which the diffusion barrier region is previously formed fully on the semiconductor layer surface before the formation of the gate electrode.

In the second embodiment as mentioned above, a concentration profile of the Halo implantation region 6 in the lateral direction is shown as the structure that the Halo implantation region 6 is formed to have a trapezoidal shape where a concentration is constant in the lateral direction. However, the present invention is not limited to this. It is in practical that the Halo implantation region 6 is formed to have a concentration profile in which the impurity density gradually decreases in a direction from the both edges of the SD extension regions 4 to the low concentration region 5. In this case, a neutral region is difficult to be formed compared with the case of the trapezoidal shape, and a fully depleted MOSFET operation can be achieved. Moreover, because the width on the side of the buried insulating film is made larger, it is possible to suppress the back channel effect.

Figure 9:
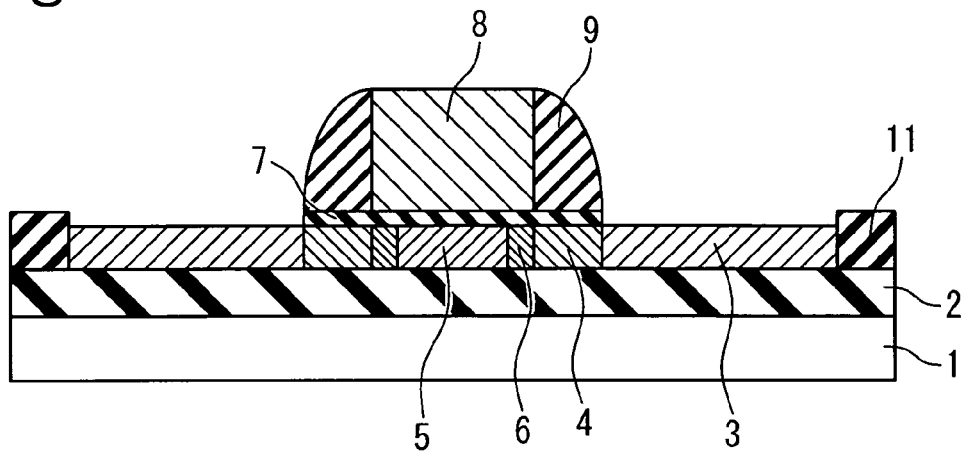
FIG. 9 is a cross section view showing the structure of the semiconductor device according to a third embodiment of the present invention.

FIG. 9 shows a semiconductor device according to the third embodiment of the present invention. Referring to FIG. 9, a buried insulating film 2 in thickness from 100 nm to 500 nm is formed on a substrate 1. Moreover, a semiconductor layer in a thickness from about 100 nm to 500 nm is laminated to form a SOI substrate of a laminated structure. On the SOI substrate, SD regions 3, SD extension regions 4, a low concentration region 5 as a channel region, and a Halo implantation region 6 formed between the low concentration region 5 and each of the SD extension regions 4 are formed. Moreover, a gate insulating film 7, a gate electrode 8, side wall insulating films 9 are formed in the same way as the above mentioned first and second embodiments.

Figure 10:
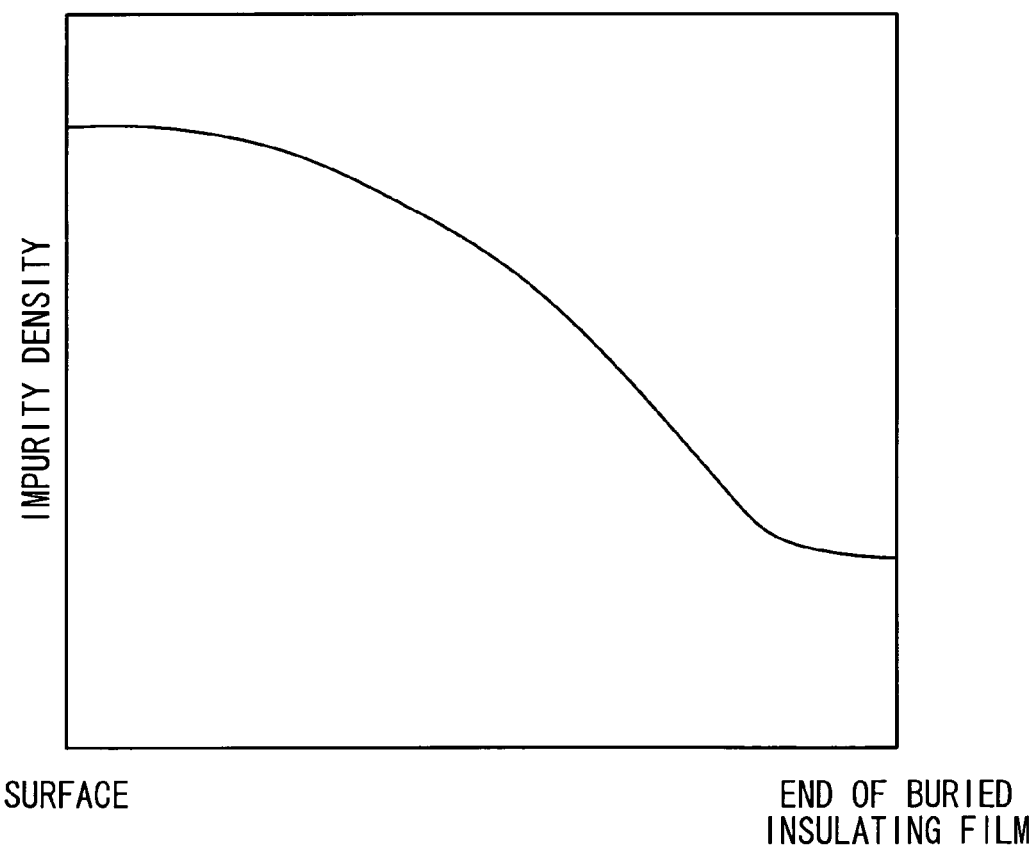
FIG. 10 is a diagram showing an impurity density profile in the semiconductor device according to the third embodiment of the present invention.

FIG. 10 shows an impurity concentration profile in the deep direction in the low concentration region 5 of the semiconductor device according to the third embodiment of the present invention. As shown in FIG. 10, the low concentration region 5 as the channel region has a nonuniform concentration profile, in which the concentration is high on the side near to the gate electrode 8, and is low on the side near to the buried insulating film 2. In this way, by localizing the impurity atoms on the side of the surface, and by setting the impurity concentration on the side of the buried insulating film to be low, a depletion layer spreads largely on the side of the buried insulating film. For this reason, it is possible to realize the same fully depleted MOSFET operation as in case of an SOI structure which has the film thickness corresponding to the depth of high concentration region of the low concentration region 5, even if the film thickness of the SOI structure is thick. It is desirable for realizing the fully depleted MOSFET operation that the depth of the region with a high concentration is equal to or less than about ¼ length of the gate length.

Figure 11:
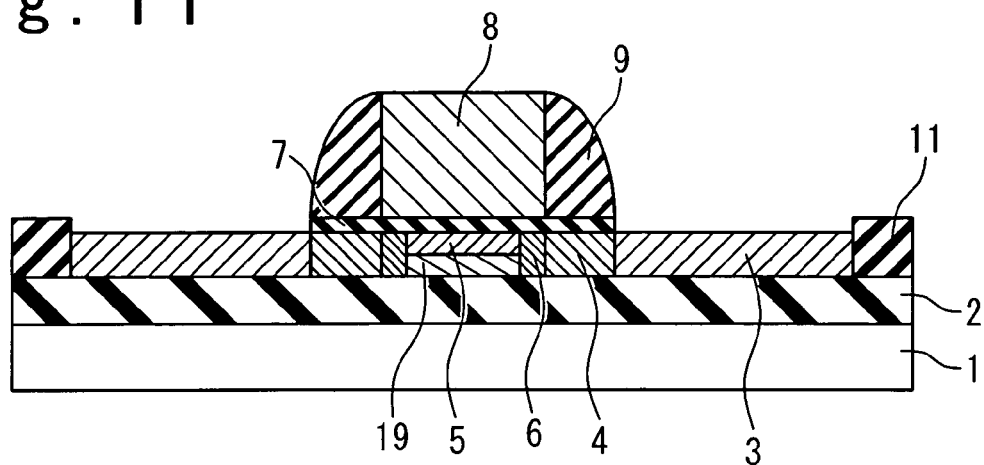
FIG. 11 is a cross section view showing the structure of the semiconductor device according to a fourth embodiment of the present invention.

FIG. 11 shows a semiconductor device according to the forth embodiment of the present invention. A buried insulating film 2 in a thickness from 10 nm to 500 nm is formed on a substrate 1. A substrate of the laminate structure is formed, in which a semiconductor layer in a thickness about 10 nm to 500 nm film is laminated on the buried insulating film 2. On an SOI substrate are formed SD regions 3, SD extension regions 4, a low concentration region 5, a Halo implantation region 6 formed between the low concentration region 5 and each of the SD extension regions 4 and a buried diffusion barrier region 19 under the low concentration region 5 on the side of the buried oxide film 2. Moreover, a gate insulating film 7, a gate electrode 8, side wall insulating films 9 are formed in the same way as the above mentioned first to third embodiments.

Figure 12:
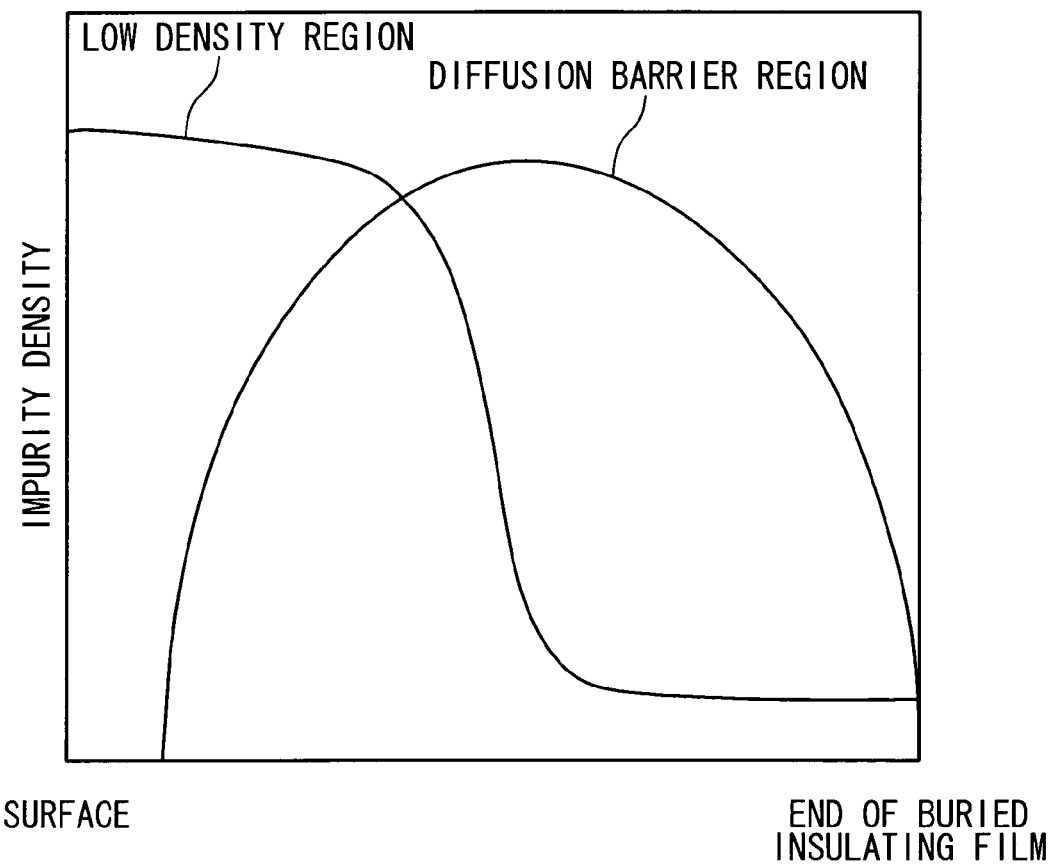
FIG. 12 is a diagram showing an impurity density profile in the semiconductor device according to the fourth embodiment of the present invention.

FIG. 12 shows an impurity concentration profile in the deep direction in the low concentration region 5 and the diffusion barrier region 19 below the gate insulating film 7 in the semiconductor device according to the forth embodiment of the present invention. As shown in FIG. 12, the low concentration region 5 as a channel region has a nonuniform concentration profile, in which the concentration is high on the side near to the gate electrode 8, and is low on the side near to the buried insulating film 2. Moreover, the buried diffusion barrier region 19 is formed on a deeper side region on the side of the buried oxide film 2. Here, in case of an NMOS FET, the impurity of the low concentration region 5 is an element such as boron, and the impurity in the buried diffusion barrier region 19 is an element such as fluorine, carbon, and indium. Moreover, it is desirable that the impurity atoms in the low concentration region 5 are implanted in a depth region from 10 nm to 30 nm from the gate insulating film 7. By forming the buried diffusion barrier region 19 in this way, it is possible to effectively prevent that the impurity atoms in the high concentration region diffuse in the depth direction. Thus, it is possible to form a shallower impurity distribution precisely.

Figure 13A:
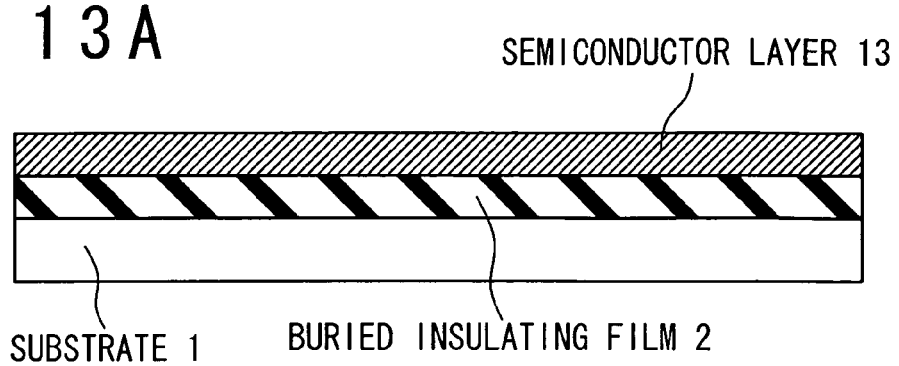
FIGS. 13A to 13H are cross sectional views showing a manufacturing method of the semiconductor device according to the fourth embodiment of the present invention.

FIG. 13A to 13H show a manufacturing method of the semiconductor device according to the forth embodiment of the present invention. As shown in FIG. 13A, a buried insulating film 2 with the thickness of 100 nm is formed on the substrate 1. A semiconductor layer 3 in a thickness from 5 nm to 2 μm is laminated on the buried insulating film 2.

Figure 13B:
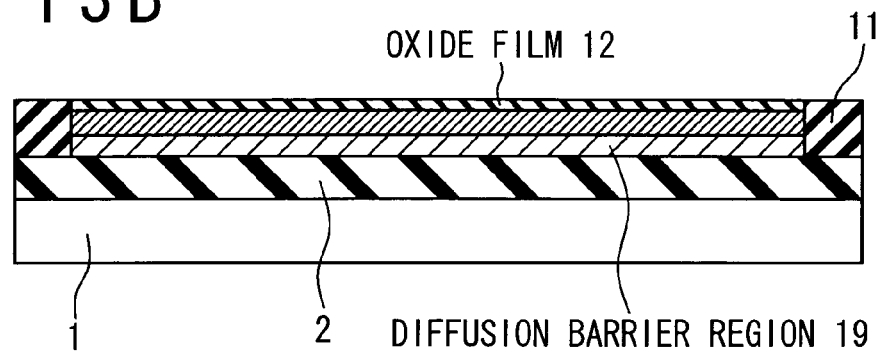

Next, as shown in FIG. 13B, an oxide film 12 with the thickness of about 10 nm is formed on the semiconductor layer 3. An impurity such as fluorine is added into the semiconductor layer 3 by the ion implantation method to form a buried diffusion barrier region 19. Then, a low concentration region 5 is formed by the ion implantation method. Here, in case of NMOS, the low concentration region 5 is formed in a dose quantity from $10^{12}$ cm$^{-2}$ to $10^{16}$ cm$^{-2}$ through the ion implantation of the low energy of 0.5 KeV to 1 Kev. As a result, a concentration profile is formed to decrease gradually from the surface of the semiconductor layer 3.

Figure 13C:
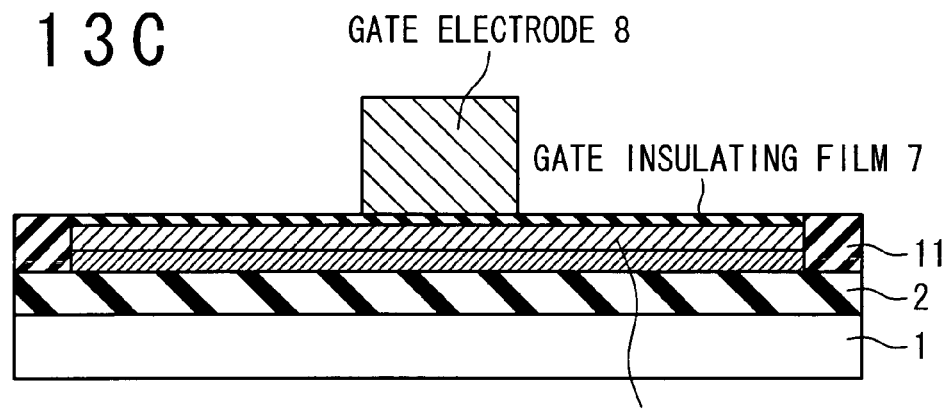

Next, as shown in FIG. 13C, the oxide film 12 is removed and a gate insulating film 7 with the thickness of about 2 nm is formed. The, a polysilicon film is deposited in the thickness of 200 nm and is selectively etched to form a gate electrode 8.

Figure 13D:
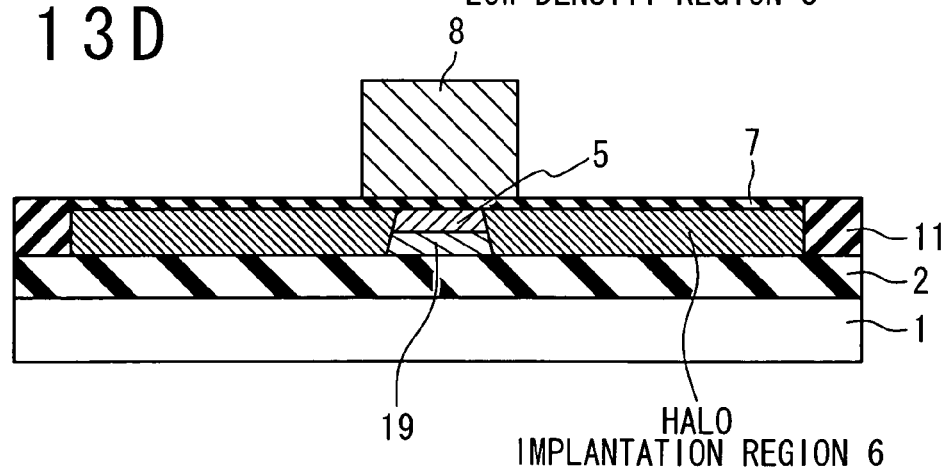

Next, as shown in FIG. 13D, the ions are implanted from the diagonal or oblique direction, that is, boron is implanted in case of NMOS, and arsenic is implanted in case of PMOS. Here, by selecting angle and energy in the ion implantation, the Halo implantation region 6 can be defined outside the diffusion barrier region 19.

Figure 13E:
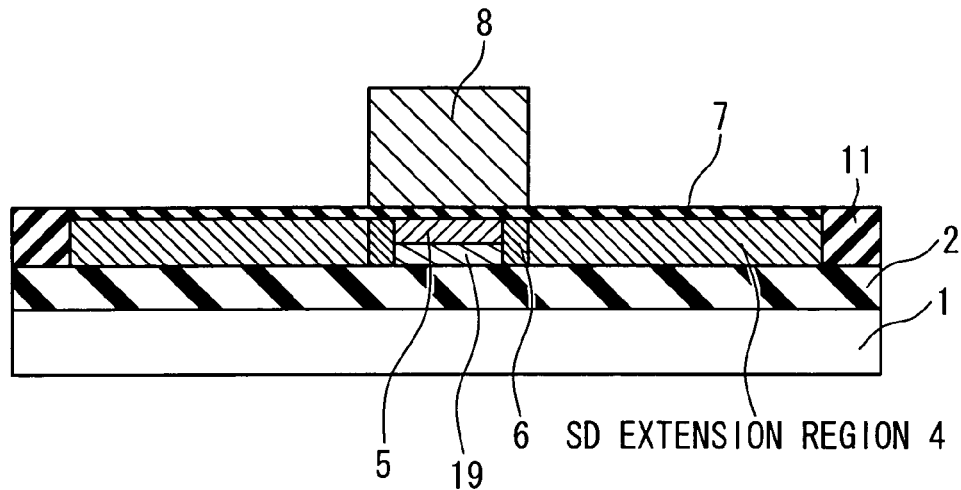

Next, as shown in FIG. 13E, the impurities of a conductive type opposite to that of the low concentration region 5 and the Halo implantation region 6, for example, arsenic in the case of NMOS and boron in the case of the PMOS, are added through the ion implantation to form the SD extension regions 4. The direction of the ion implantation is perpendicular so that a Halo implantation region 6 is formed on the inside of the SD extension region 4.

Figure 13F:
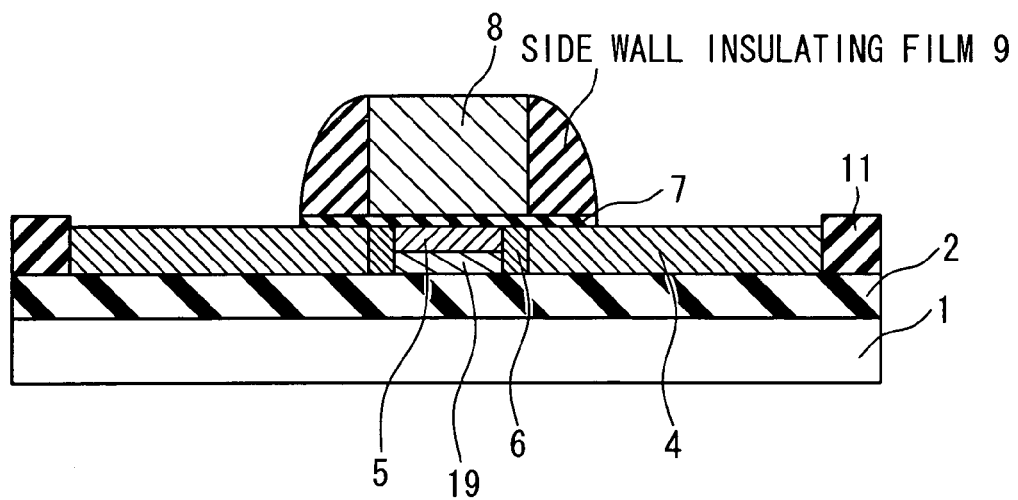

Next, as shown in FIG. 13F, an insulating film is deposited in the thickness of about 150 nm by the CVD method and then the insulating film is removed through the anisotropic etching to form side wall insulating films 9 on side walls of the gate electrode 8. At the same time, the gate insulating film 7 is removed.

Figure 13G:
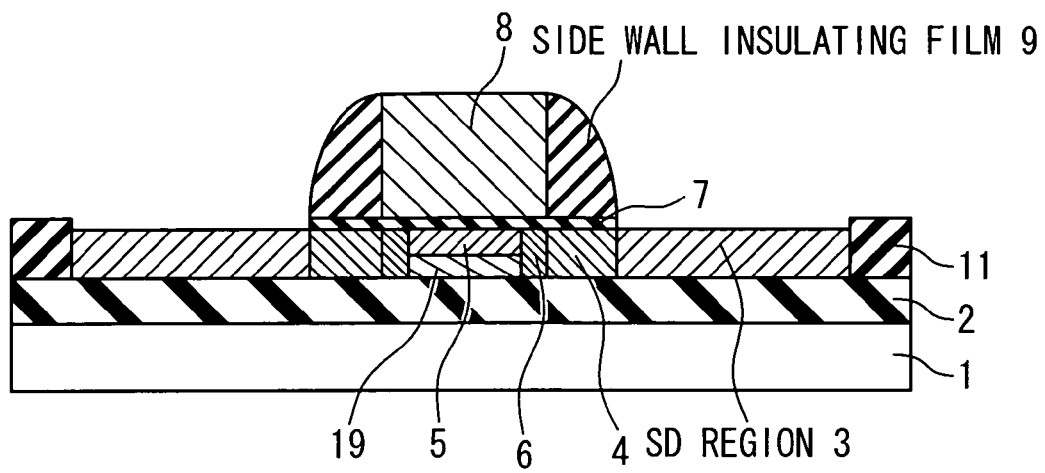
Figure 13H:
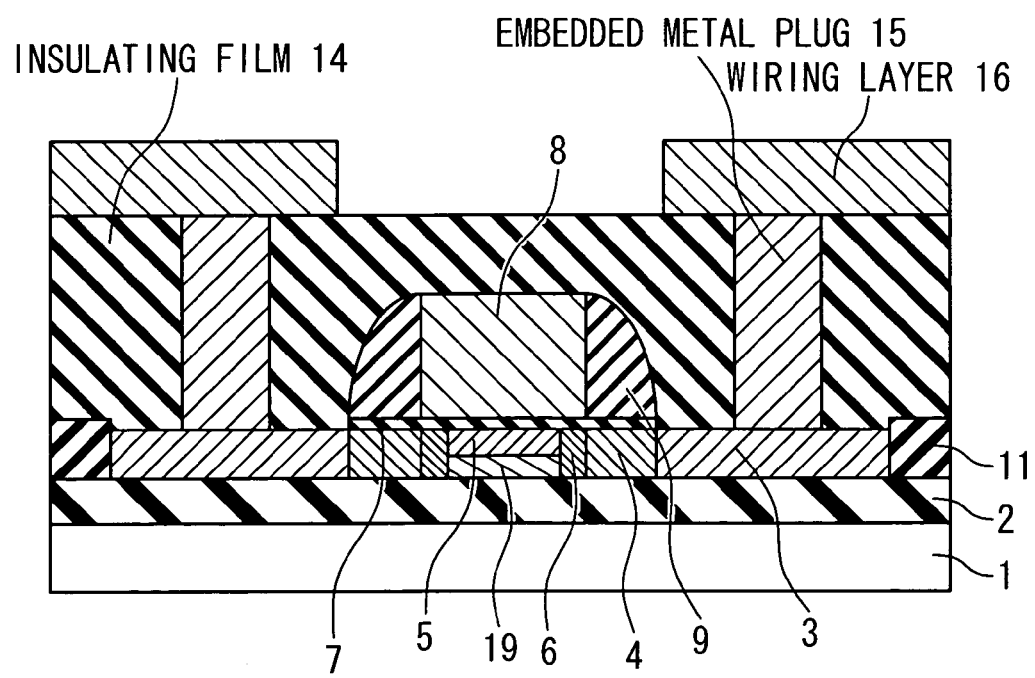

Next, as shown in FIG. 13G, the gate electrode 8 and the side wall insulating films 9 are used as a mask, and the impurity is added by the ion implantation method to form the SD regions 3.

Next, as shown in FIG. 13G, the insulating film 14 is formed over the whole surface and openings for contact regions are produced in the insulating film 14. A buried metal 15 is deposited to fill the contact regions. Subsequently, wiring line layers 16 are selectively formed on the contact region. Thus, the FET is produced.

According to the forth embodiment, the diffusion barrier region 17 is previously formed before the ion implantation process of the low concentration region. Thus, it is possible to restrain the deep diffusion of the impurities of the low concentration region spreads forming. In this way, the impurity density of the low concentration region 5 near to the gate insulating film 7 can be kept high so that the fully depleted MOSFET operation can be carried out. Moreover, the threshold voltage can be set high.

Figure 14:
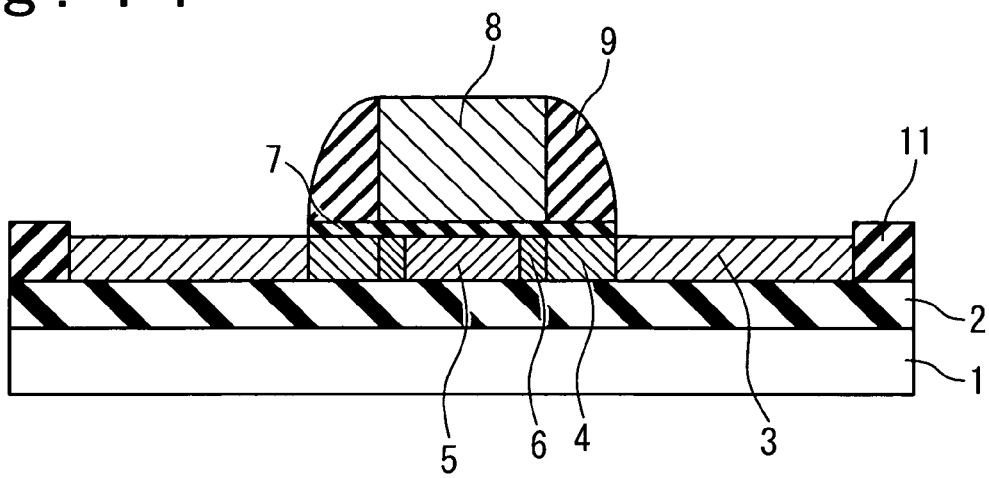
FIG. 14 is a cross section view showing the structure of the semiconductor device according to a fifth embodiment of the present invention.

FIG. 14 shows a semiconductor device according to the fifth embodiment of the present invention. A buried insulating film 2 in a thickness from 10 nm to 500 nm is formed on a substrate 1. A semiconductor layer in a thickness from about 10 nm to 500 nm is laminated to form a SOI substrate of a laminated structure. On the SOI substrate are formed SD regions 3, SD extension regions 4, a low concentration region 5 as a channel region, and Halo implantation regions 6 which are respectively formed between the low concentration region 5 and the SD extension regions 4. Moreover, a gate insulating film 7, a gate electrode 8, side wall insulating films 9 are formed in the same way as the first and second embodiments.

Figure 15:
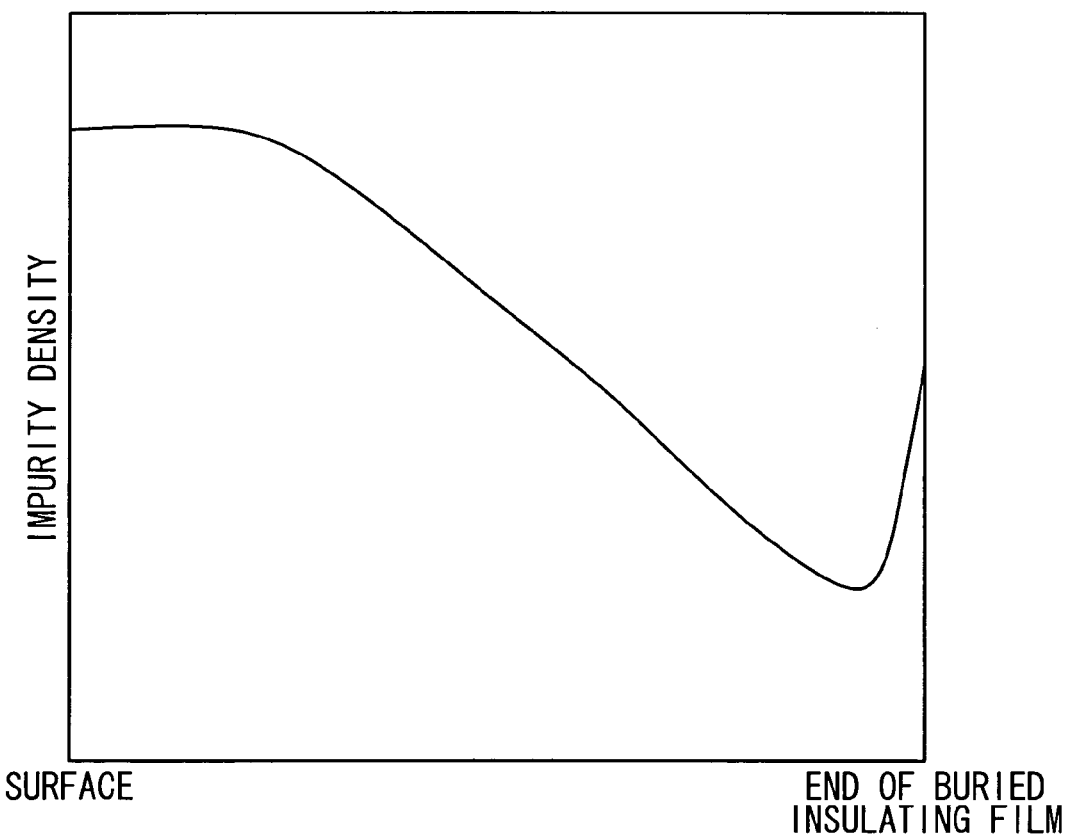
FIG. 15 is a diagram showing an impurity density profile in the semiconductor device according to the fifth embodiment of the present invention.

FIG. 15 shows an impurity concentration profile the Halo implantation region 6 in the depth direction in the semiconductor device according to the forth embodiment of the present invention. As shown in FIG. 15, the low concentration region 5 as the channel region has a nonuniform concentration profile, in which the concentration is high on the side near to the gate electrode 8, and is low on the side of the buried insulating film 2, and is high again at the phase boundary of the buried insulating film 2. In this way, by localizing the impurity ions on the side of the surface, and by setting the impurity density on the side of the buried insulating film to be low, a depletion layer largely spreads on the side of the buried insulating film 2. Therefore, though a thickness of the SOI film is thick, a fully depleted MOSFET operation can be carried out in the same way as a transistor which has the film thickness corresponding to the depth of the high concentration region in the low concentration region 5 on the surface side. Moreover, by setting the concentration near to the buried insulating film 2 to be high, it is possible to restrain so-called back channel operation, in which a channel is formed on the side of the buried insulating film 2. In order to set the concentration of the low concentration region near to the buried insulating film 2 to be high, the ion implantation with high energy is preferable. Besides, methods are applicable such as a method of adding the impurity into the buried insulating film 2 previously and a method of segregating ions in a surface.

Figure 16:
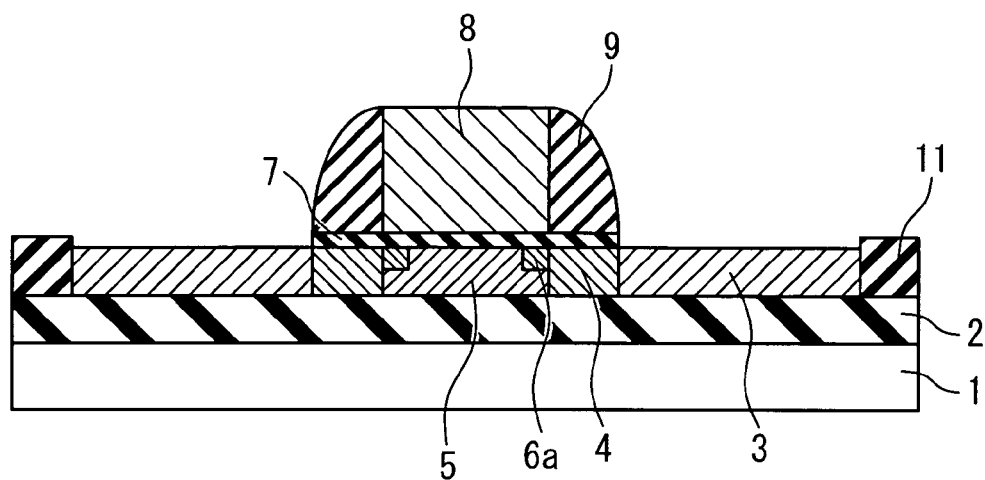
FIG. 16 is a cross section view showing the structure of the semiconductor device according to a sixth embodiment of the present invention.

FIG. 16 shows the semiconductor device according to the sixth embodiment of the present invention. A buried insulating film 2 in a thickness from 10 nm to 500 nm is formed on a substrate 1. A semiconductor layer in a thickness from 10 nm to 500 nm is laminated on the buried insulating film 2 to form a SOI substrate of a laminated structure. On the SOI substrate of the laminated structure are formed SD regions 3, SD extension regions 4, a low concentration region 5 as a channel region, and a Halo implantation region 6 formed between the low concentration region 5 and each of the SD extension regions 4. Moreover, a gate insulating film 7, a gate electrode 8, and side wall insulating films 9 are formed.

An impurity density profile of the low concentration region 5 in the depth direction is the same as the profiles shown in FIG. 10, FIG. 12, and FIG. 15. As shown in FIG. 16, the Halo implantation regions 6 are formed on the surface side of the SOI layer, but are not formed on the side near to the insulating film 1. In the first embodiment, the concentration of a lower portion of the Halo implantation region 6 near to the buried insulating film 2 is set higher than that of a lower portion of the low concentration region 5 near to the buried insulating film 2. Therefore, a neutral region is formed in the Halo implantation region 6, and there is a case that a partially depleted SOI-MOSFET operation is easy to be carried out. However, the Halo implantation region 6 is formed only on the surface side of a channel region in the sixth embodiment and thereby it is possible to restrain the generation of the partially depleted SOI-MOSFET operation in the Halo region 6.

Figure 17:
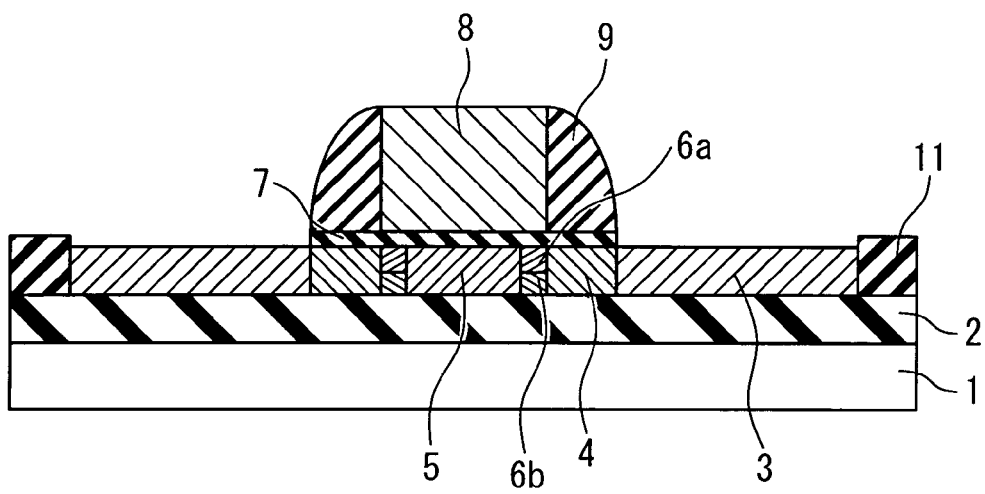
FIG. 17 is a cross section view showing the structure of the semiconductor device according to a seventh embodiment of the present invention.

FIG. 17 shows a semiconductor device according to the seventh embodiment of the present invention. A buried insulating film 2 in a thickness from 10 nm to 500 nm is formed on a substrate 1. A semiconductor layer in a thickness from about 10 nm to 500 nm is laminated on the buried insulating film 2 to form a SOI substrate of a laminated structure. On the SOI substrate are formed SD regions 3, SD extension regions 4, a low concentration region 5 as a channel region, and a Halo implantation region 6a with a high concentration and a Halo implantation region 6b with a low concentration formed between the low concentration region 5 and each of the SD extension regions 4. Moreover, a gate insulating film 7, a gate electrode 8, and side wall insulating films 9 are formed so that forming a FET is completed.

An impurity density profile of the low concentration region 5 in the depth direction is as same as the profiles shown in FIG. 10, FIG. 12, and FIG. 15. As shown in FIG. 17, the Halo implantation region 6a is formed on the surface side of the SOI layer, and the Halo implantation region 6b is formed on the side of the buried insulating film 2. Here, the impurity densities of the Halo implantation regions are set to be higher than the concentration of the low concentration region 5 on the near side of the buried insulating film 2 to restrain the generation of a punch-through. Moreover, the density of the Halo implantation region 6b is set lower than a density in which a short channel effect in the Halo implantation region 6a can be restrained. Thus, a partially depleted SOI-MOSFET operation can be further restrained.

Figure 18:
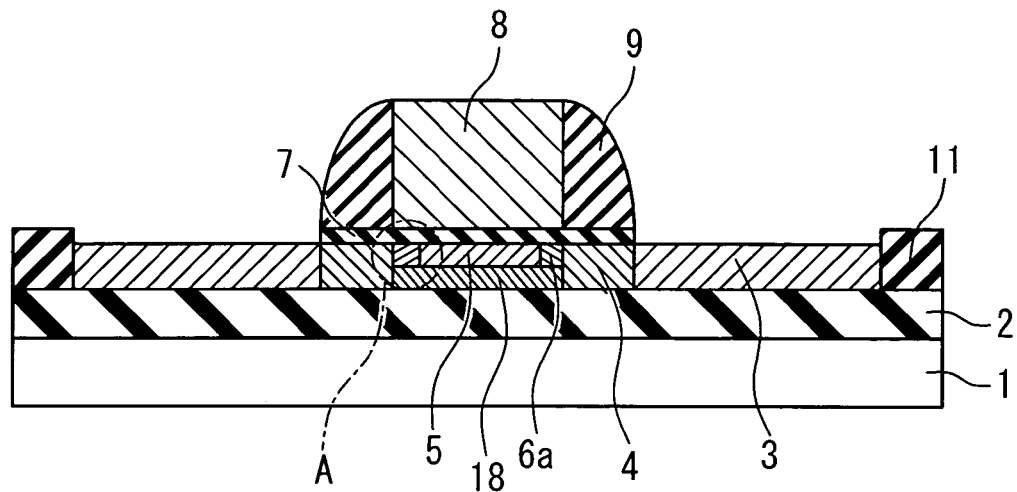
FIG. 18 is a cross section view showing the structure of the semiconductor device according to an eighth embodiment of the present invention.

FIG. 18 shows a semiconductor device according to the eighth embodiment of the present invention. A buried insulating film 2 in a thickness from 10 nm to 500 nm is formed on a substrate 1. A semiconductor layer in a thickness from 10 nm to 60 nm is laminated on the buried insulating film 2 to form a SOI substrate. On the SOI substrate of the laminated structure are formed SD regions 3, SD extension regions 4, a low concentration region 5, and a Halo implantation region 6 formed between the low concentration region 5 and each of the SD extension regions 4. A buried implantation region 18 is formed under the Halo implantation regions 6 and the low concentration regions 5 and on the buried insulating film 2. Moreover, a gate insulating film 7, a gate electrode 8, and side wall insulating films 9 are formed. The impurity of a conductive type opposite to that of the Halo implantation region 6 and the low concentration region 5 is implanted into the buried implantation region 18.

Figure 19:
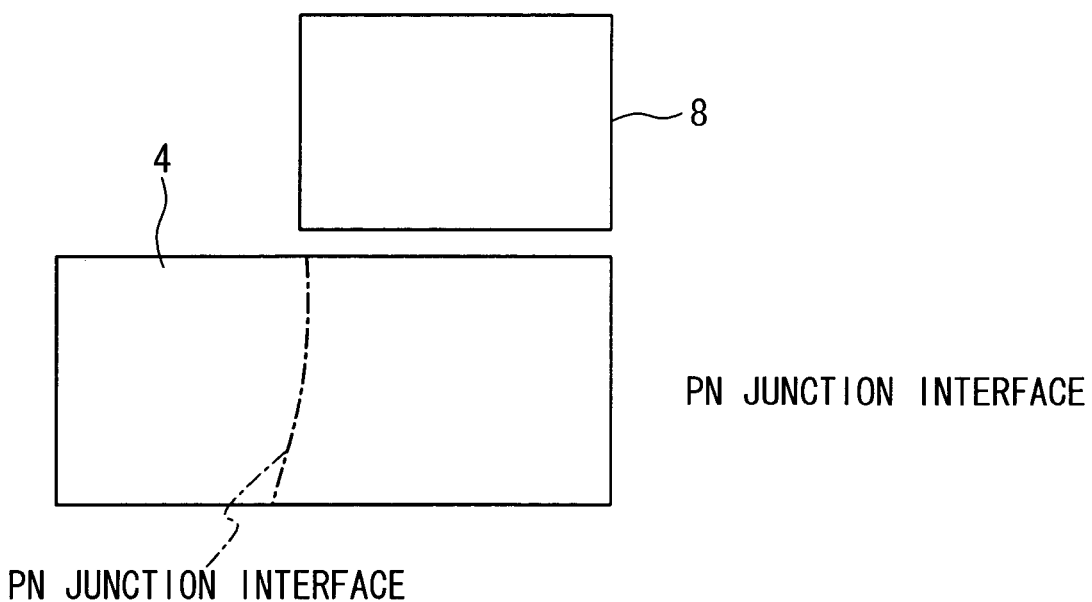
FIG. 19 is a diagram showing an impurity density profile in the semiconductor device according to the eighth embodiment of the present invention.

In the semiconductor device according to the eighth embodiment of the present invention, an impurity density profile of the low concentration region 5 in the depth direction is the same as FIG. 10 or FIG. 12 or is uniform. FIG. 19 shows an example of detail of the impurity density profile in a portion A of FIG. 18. The impurity, e.g., boron is implanted and added to the low concentration region 5 in the energy of about 0.5 Kev and in a dose quantity from $1\times10^{13}$ cm$^{-3}$ to $5\times10^{13}$ cm$^{-3}$, especially $1\times10^{13}$ cm$^{-3}$ to $3\times10^{13}$ cm$^{-3}$. Moreover, another impurity, e.g., arsenic is implanted and added to the low concentration region 5 in the energy of about 50 Kev and in a dose quantity from $0.5 \times 10^{13}$ cm$^{-3}$ to $5 \times 10^{13}$ cm$^{-3}$, especially $0.5 \times 10^{13}$ cm$^{-3}$ to $2 \times 10^{13}$ cm$^{-3}$. After the gate electrode 8 is formed, the impurity ions BF$_2$ are implanted in the energy of about 20 Kev and in a dose quantity of approximately $3.5 \times 10^{13}$ cm$^{-3}$ from a proper diagonal or oblique angle, for example, at 30 degrees from a perpendicular direction to a wafer surface to form the Hallo implantation region.

By forming the buried implantation region 18 of the conductive type opposite to those of the Halo implantation region 6 and the low concentration region 5, a carrier concentration under the Halo implantation regions 6 and the low concentration regions 5 is cancelled based on the degrees of depths of P-type impurity and N-type impurity. As a result, the Halo implantation region 6 and the low concentration region 5 substantively decrease in concentration under these regions and have the conductive type of an N-type. As shown in FIG. 19, the concentration of the Halo implantation region 6 decreases sharply in the depth direction while the Halo implantation region 6 keeps the P-type, and the low concentration region 5 decreases further sharply in a region deeper than the decrease region and changes into the N-type by a PN junction 19.

FIG. 19 shows a case that the Halo implantation region 6 keeps a P-type, and the Halo implantation region 6 has changed into the N-type. However, it is possible to implant the impurity such that the concentrations of the Halo implantation region 6 and the low concentration region 5 decrease sharply while the Halo implantation region 6 and the low concentration region 5 keep the P-type. It is also possible to set the density distribution proper effectively by the multi-layer structure as in the seventh embodiment. It is effective in achievement of the objects of the present invention to change a lower region of each of the Halo implantation regions 6 and the low concentration region 5 into the N-type. In this case, it is essentially important to restrain the concentration in a low concentration of the N-type to the extent that a punch-through is not caused.

By forming the buried impurity region 18 in which the impurity concentration continuously or rapidly increases in the depth direction, the impurity density profiles of the Halo implantation region 6 and the low concentration region 5 have shapes such that the impurity effectively exists in the surface region on the side of the gate to restrain decrease in the minimum potential of the SOI layer and to restrain the partially depleted SOI-MOSFET operation. The buried impurity region 18 can provide the conspicuous restraint effect by a simple manufacturing process without the precise control of the impurity density profiles of the Halo implantation region 6 and the low concentration region 5.

Figure 20:
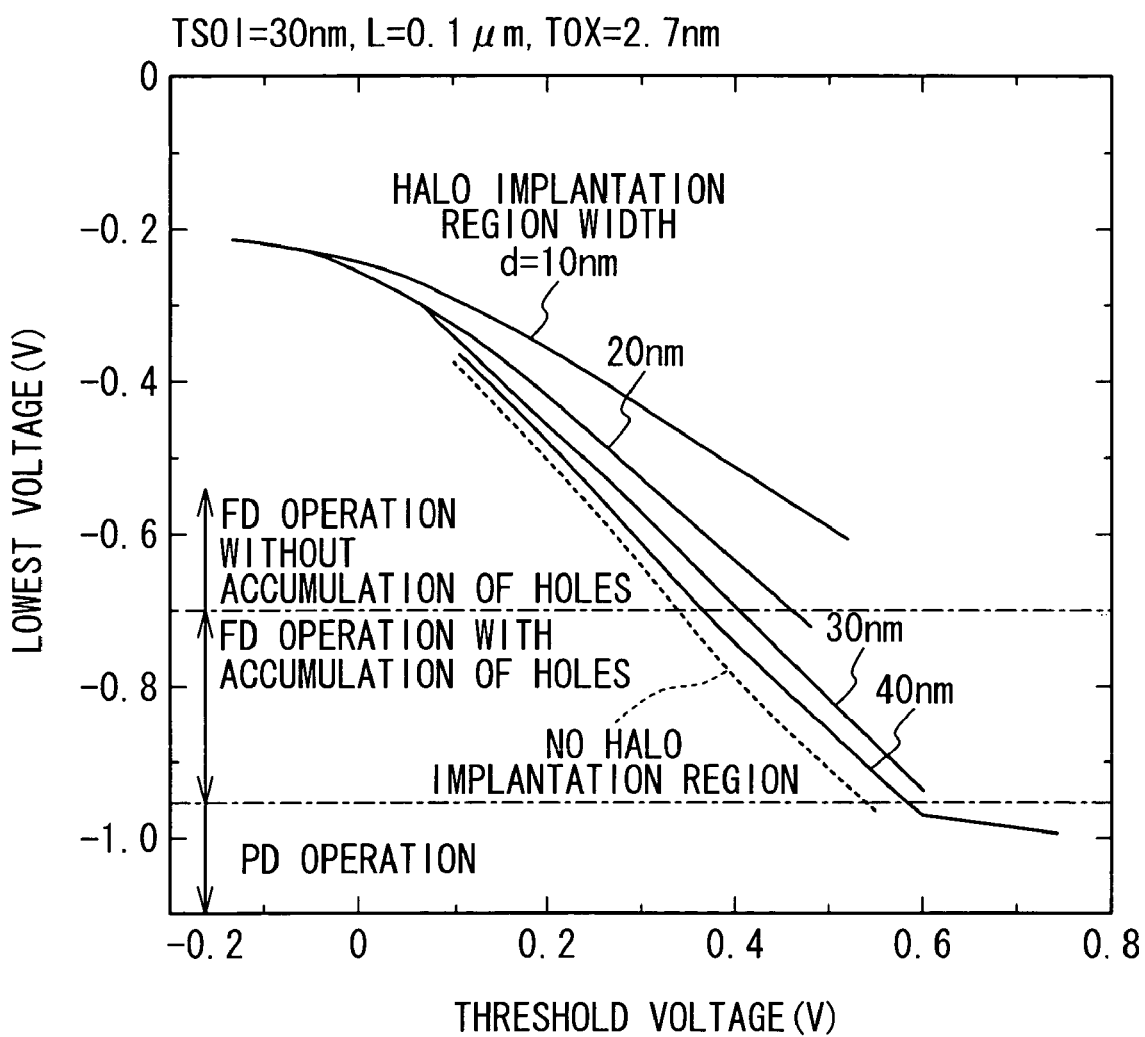
FIG. 20 is a diagram showing a relationship of threshold voltage and minimum potential.

FIG. 20 shows a relation between threshold voltage and the minimum potential in the SOI layer using the width of the Halo implantation region as a parameter. In the MOSFET using the SOI substrate with the Halo implantation region width less than or equal to 30 nm, especially, less than or equal to 20 nm, a problem of the decrease of the minimum potential in the SOI layer is caused. The problem can be prevented by implanting the impurity in a region of the SOI layer apart from the source/drain (SD) region by 20 nm to 30 nm, especially, in a lower portion of the region of the SOI layer. This principle is clearly shown in FIG. 21. According to such principle, the Halo implantation region 6 functions effectively in the semiconductor device designed to have a narrow lateral direction width and a very small gate length. Thus, as shown in FIG. 20, the decrease in the minimum potential can be achieved while the Halo implantation region 6 has a width equal to or less than 30 nm, preferably, equal to or less than 20 nm and the threshold voltage in the fully depleted MOSFET operation is kept high.

Figure 21:
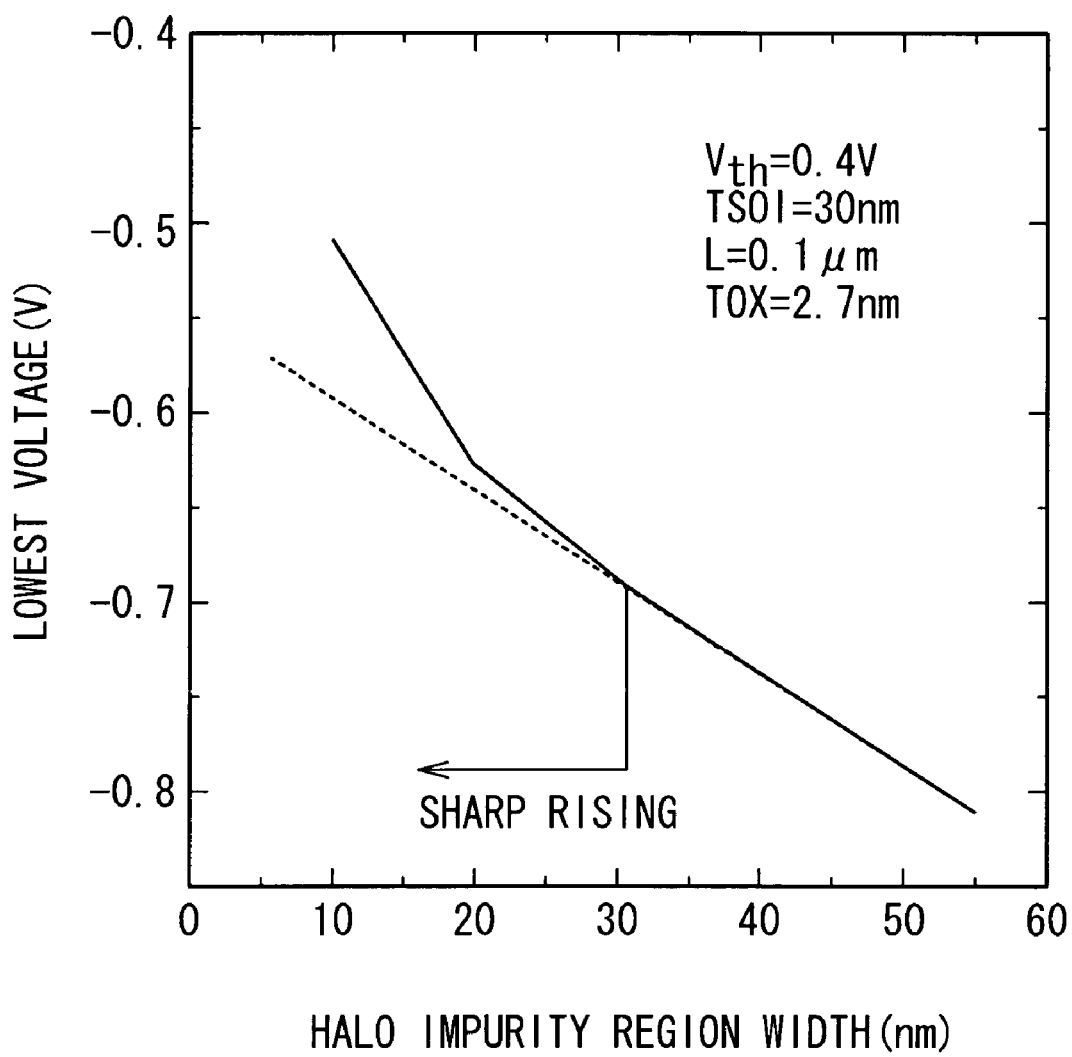
FIG. 21 is a diagram showing a relationship of implantation width and minimum potential.

FIG. 21 shows a relation with the width of the Halo implantation region 6 and the minimum potential of the semiconductor device. The rise of the minimum potential of the semiconductor device is steeper when the width of the Halo implantation region becomes narrower than 30 nm, compared with the case that the width of the Halo implantation region is equal to or more than 30 nm. If the width of the Halo implantation region becomes narrower than 20 nm, the rise of the minimum potential of the semiconductor device is further steeper compared with the case that the width of the Halo implantation region is equal to or more than 30 nm.

Figure 22:
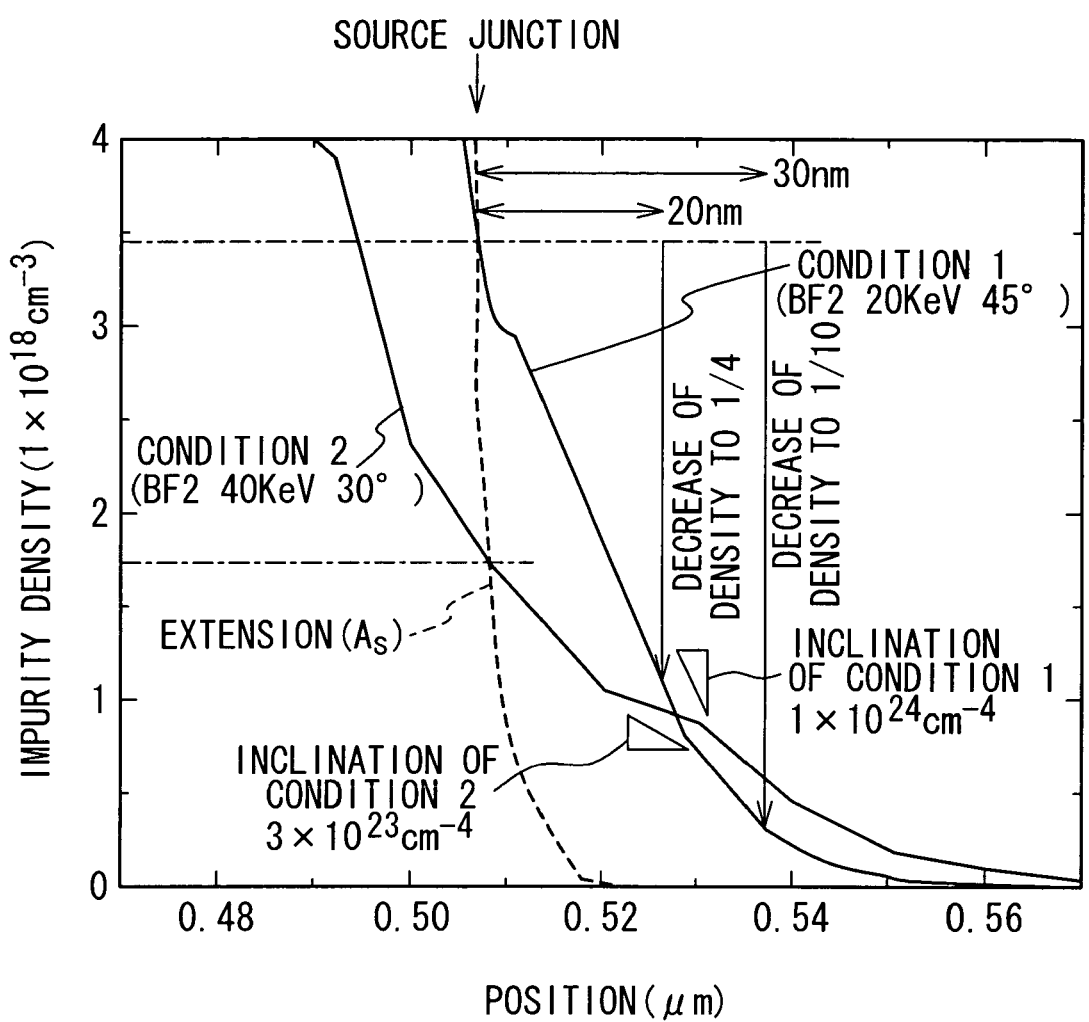
FIG. 22 is a diagram showing a relationship of position and impurity concentration.

FIG. 22 shows the impurity concentration inclination in the lateral direction. The horizontal axis indicates a relative position in the lateral direction, containing the 30-nm width of the Halo implantation region 6. The vertical axis indicates the impurity concentration. The impurity concentration in a certain reference position, for example, a source junction position is approximately $3.5 \times 10^{18}$ cm$^{-3}$. A graph under a condition 1 shows a concentration inclination in the present invention in which impurities is implanted under the condition mentioned in the graph. A graph under a condition 2 shows a concentration inclination in the conventional semiconductor device in which the impurity is implanted under the condition mentioned in the graph. The inclination under the condition 2 is gentle and is approximately $3 \times 10^{23}$ cm$^{-4}$ on the average in case of the width of 30 nm. On the other hand, the inclination under the condition 1 of the present invention is approximately $1 \times 10^{24}$ cm$^{-4}$ on the average in case of the width of 30 nm. FIG. 22 shows the inclination between a distance from the source junction plane and the concentration decrease. The concentration decrease by $\frac{1}{10}$ is equivalent to the width of 30 nm, and the concentration decrease by $\frac{1}{4}$ is equivalent to the width of 20 nm.

Figure 23:
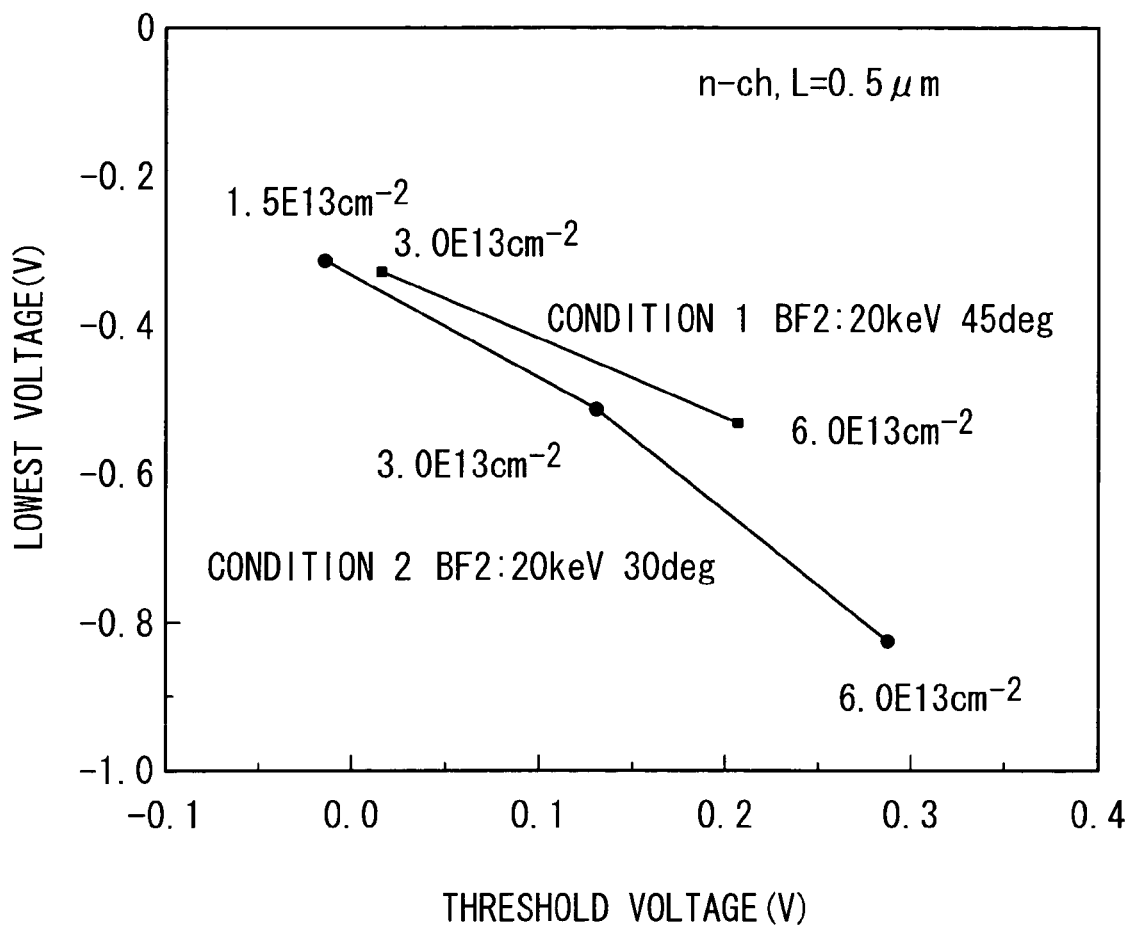
FIG. 23 is a diagram showing another relationship of threshold voltage and minimum potential.

FIG. 23 shows a relation between the threshold voltage and the minimum potential and shows comparison between the above-mentioned condition 1 and condition 2. It is obvious that the minimum potential in the SOI layer is high in the state of high threshold voltage, as shown by the graph of the condition 1 according to the present invention.

As shown in FIG. 22, in case that the impurity concentration in the Halo implantation region in the lateral direction has inclination, it could be understood that the minimum potential decrease becomes small when the impurity is implanted into the width of the 30 nm or 20 nm in the Halo implantation region 6, especially the impurity is implanted into a region lower than the Halo implantation region 6, by setting the concentration at a position apart from the source/drain end by 30 nm to $\frac{1}{10}$ of the concentration at the source/drain end, by setting the concentration at a position apart from the source/drain end by 20 nm to $\frac{1}{4}$ of the concentration at the source/drain end, or by setting the concentration inclination at a position apart from the source/drain end by 20 nm to $1 \times 10^{24}$ cm$^{-4}$. As a result, it is possible to restrain the decrease in the minimum potential, to keep a fully depleted MOSFET operation, and to restrain a floating body effect.

FIG. 20 indicates that it is possible to restrain the potential decrease in the lower region of the Halo implantation region, to keep the fully depleted MOSFET operation, and to restrain the floating body effect, by limiting a region of the Halo implantation region where the impurity is implanted to a high concentration, to the surface region on the side of the gate insulating film, or by setting the concentration in the surface region to three times higher than a peak value of the concentration in the lower region. It is possible to stabilize the fully depleted MOSFET operation, by applying the concentration inclination in the depth direction and the concentration inclination in the lateral direction to the Halo implantation region.

Further, it is possible to keep the fully depleted MOSFET operation in the state in which the threshold voltage is held high in the semiconductor device with a smaller gate length, by forming the impurity region for the effective channel region shallowly in the surface region of the Halo implantation region on the side of the gate insulating film. Also, it is possible to restrain a short channel effect.

In this way, a smaller fully depleted MOSFET device can be formed in the state that the SOI film is thick. Moreover, it is possible to prevent the spreading of the Halo implantation region through a thermal treatment process by forming a diffusion barrier region on the channel side of the Halo implantation region.

Additionally, in a CMOS device, it is possible to match a diffusion rate of boron with a fast diffusion rate with a diffusion rate of arsenic with a slow diffusion rate boron, by forming the diffusion barrier region in which the boron as the impurity of the Halo implantation region is added and by forming no diffusion barrier region in which the arsenic as the impurity of the Halo implantation region is added.

Moreover, it is possible to carry out the fully depleted MOSFET operation of the semiconductor device with the comparative thick SOI film under the condition that the decrease of the threshold voltage is restrained, forming the buried diffusion barrier region on the side of the buried oxide film below the channel region and by forming the Halo implantation region on the surface side to have a ununiform impurity distribution in the depth direction.

Furthermore, by adding the impurity atoms for the conductive type opposite to that of the channel region to a lower region of the channel region, the impurity concentration is high in the channel region and the impurity concentration is low in the lower region or the lower region has the opposite conductive type. In this way, it is possible to form a laminated structure by which the partially depleted SOI-MOSFET operation is hard to be caused.

According to the semiconductor device and the manufacturing method of the semiconductor device of the present invention, the width of the Halo implantation region is equal to or less than 30 nm, preferably equal to or less than 20 nm, the decrease of the minimum potential in the SOI layer is effectively restrained, the fully depleted MOSFET operation is kept, and the floating body effect is effectively restrained.

The invention claimed is:

1. A semiconductor device comprising:
a first insulating layer;
a semiconductor layer formed on said first insulating layer;
a second insulating layer on a part of said semiconductor layer; and
a gate electrode formed on said semiconductor layer through said second insulating layer,
wherein said semiconductor layer comprises:
a low concentration region formed under said gate electrode and said second insulating layer;
two diagonally or obliquely implanted high concentration regions formed in at least two regions on outer sides of said low concentration region, substantially all of said high concentration regions being under said gate electrode and said second insulating layer, and having an impurity concentration higher than that of said low concentration region, respectively; and
two source/drain regions formed in side portions outside said high concentration regions to have low concentration region side end portions, respectively, and
a width of said high concentration regions is between 20 nm and 30 nm.

2. The semiconductor device according to claim 1, wherein said semiconductor layer further comprises:
two diffusion barrier regions formed between said high concentration regions and said low concentration region, respectively, to prevent diffusion of impurity in said high concentration regions into said low concentration region.

3. The semiconductor device according to claim 1, wherein said impurity concentration decreases in a direction from said low concentration region side end portions of said source/drain regions to a center portion of said low concentration region.

4. The semiconductor device according to claim 1, wherein said impurity concentration of said high concentration region is lower than $\frac{1}{10}$ of said impurity concentration at said low concentration region side end portion of each of said source/drain regions at a position apart from said low concentration region side end portions of said source/drain regions by 30 nm.

5. The semiconductor device according to claim 1, wherein a horizontal gradient of said impurity concentration of said high concentration region is higher than $1 \times 10^{24}$ cm$^{-4}$ at a position apart from said low concentration region side end portions of said source/drain regions into a direction of said low concentration region by 20 nm.

6. The semiconductor device according to claim 1, wherein said low concentration region is an intrinsic region, said high concentration regions are of a first conductive type, and said source/drain regions are of a second conductive type which is different from said first conductive type.

7. The semiconductor device according to claim 1, wherein said low concentration region and said high concentration regions are of a first conductive type, and
said source/drain regions are of a second conductive type which is different from said first conductive type.

8. The semiconductor device according to claim 7, wherein said low concentration region comprises:
a first conductive type upper region; and
a low concentration region diffusion barrier region formed under said first conductive type upper region to prevent downward diffusion of an impurity of said first conductive type upper region.

9. The semiconductor device according to claim 7, further comprising:
a second conductive type region which is formed under said low concentration region and said high concentration region and does not contact said source/drain regions.

10. The semiconductor device according to claim 1, wherein said impurity concentration of said low concentration region is high in an upper region on a side of said second insulating layer and is low in a lower region on a side of said first insulating layer.

11. The semiconductor device according to claim 10, wherein a peak value of said impurity concentration of said upper region is larger three times than a peak value of said impurity concentration of said lower region.

12. The semiconductor device according to claim 1, wherein said impurity concentration of said low concentration region is high in an upper region on a side of said second insulating layer, becomes low in a lower region on a side of said first insulating layer, and increases again approaching a boundary with said first insulating layer.

13. A semiconductor device comprising:
a first insulating layer;

a semiconductor layer formed on said first insulating layer;
a second insulating layer formed on said semiconductor layer; and
a gate electrode formed on said semiconductor layer via said second insulating film,
wherein said semiconductor layer comprises:
a channel region formed so that substantially all of said channel region is under said gate electrode via said second insulating film; and
two source/drain regions formed outside said channel region in said semiconductor layer,
an impurity concentration of said channel region at a position 20 nm from end portions of said source/drain regions is lower than ¼ of the impurity concentration of said channel region at said end portions.

* * * * *